(12) United States Patent
Fiedler

(10) Patent No.: US 10,927,001 B2
(45) Date of Patent: Feb. 23, 2021

(54) MEMS CRYOCOOLER SYSTEMS AND METHODS

(71) Applicant: FLIR Systems, Inc., Wilsonville, OR (US)

(72) Inventor: Andreas Fiedler, Santa Barbara, CA (US)

(73) Assignee: FLIR Systems, Inc., Wilsonville, OR (US)

(*) Notice: Subject to any disclaimer, the term of this patent is extended or adjusted under 35 U.S.C. 154(b) by 0 days.

(21) Appl. No.: 16/691,499

(22) Filed: Nov. 21, 2019

(65) Prior Publication Data
US 2020/0102216 A1  Apr. 2, 2020

Related U.S. Application Data

(63) Continuation of application No. PCT/US2018/038821, filed on Jun. 21, 2018.
(Continued)

(51) Int. Cl.
*B81B 7/00* (2006.01)
*B81C 1/00* (2006.01)
*H01L 23/467* (2006.01)

(52) U.S. Cl.
CPC .......... *B81B 7/0061* (2013.01); *B81B 7/0038* (2013.01); *B81B 7/0093* (2013.01);
(Continued)

(58) Field of Classification Search
None
See application file for complete search history.

(56) References Cited

U.S. PATENT DOCUMENTS 5,457,956 A * 10/1995 Bowman ............... F02G 1/0435
                                                    257/E23.096
5,813,235 A *  9/1998 Peterson ............... F25B 9/14
                                                    60/518
(Continued)

FOREIGN PATENT DOCUMENTS

| CN | 1103928 | 6/1995 |
|---|---|---|
| CN | 101825368 | 9/2010 |
| CN | 102245887 | 11/2011 |
| CN | 104390383 | 3/2015 |
| CN | 106233081 | 12/2016 |

OTHER PUBLICATIONS

Guo, Dongzhi et al., Modeling System Dynamics in a MEMS-Based Stirling Cooler, Proceedings of the 2011 COMSOL Conference in Boston, 4 pages.
(Continued)

*Primary Examiner* — Benjamin P Sandvik
(74) *Attorney, Agent, or Firm* — Haynes and Boone, LLP

(57) ABSTRACT

Techniques are disclosed for systems and methods using microelectromechanical systems MEMS techniques to provide cryogenic and/or general cooling of a device or sensor system. In one embodiment, a system includes a compressor assembly and MEMS expander assembly in fluid communication with the compressor assembly via a gas transfer line configured to physically separate and thermally decouple the MEMS expander assembly from the compressor assembly. The MEMS expander assembly includes a plurality of expander cells each including a MEMS displacer, a cell regenerator, and an expansion volume disposed between the MEMS displacer and the cell regenerator, and the plurality of cell regenerators are configured to combine to form a contiguous shared regenerator for the MEMS expander assembly.

20 Claims, 20 Drawing Sheets

Related U.S. Application Data

(60) Provisional application No. 62/524,318, filed on Jun. 23, 2017.

(52) U.S. Cl.
CPC .... B81C 1/00309 (2013.01); *B81B 2201/054* (2013.01); *H01L 23/467* (2013.01)

(56) References Cited

U.S. PATENT DOCUMENTS

| | | | |
|---|---|---|---|
| 6,272,866 | B1 | 8/2001 | Tsai et al. |
| 6,385,973 | B1 | 5/2002 | Moran |
| 2005/0000233 | A1 | 1/2005 | Hao et al. |
| 2007/0261416 | A1* | 11/2007 | Harvey ............ F25B 9/145 62/6 |
| 2009/0056330 | A1 | 3/2009 | Formosa |

OTHER PUBLICATIONS

Patterson, D.E., et al., CVD Diamond Based Miniature Stirling Cooler, Cryocoolers 14, International Cryocooler Conference, Inc. Boulder, CO, 2007, pp. 95-104.

Nanohmics, Inc., SBIR Project: High Efficiency MEMS Based Cryocooler, NASA 02-II E1.07-9079. <URL: https://www.sbir.gov/sbirsearch/detail/243107>.

Sobol, S. et al., Development of a Linear Compressor for Stirling-Type Cryocoolers Activated by Piezoelectric Elements in Resonance, Cryocoolers 17, International Cryocooler Conference, Inc. Boulder, CO, 2012, pp. 331-340.

Sobol, S. et al., Linear Resonance Compressor for Stirling-Type Cryocoolers Activated by Piezoelectric Stack-Type Elements, IOP Conf. Series: Materials Science and Engineering, vol. 101, 2015, 9 pages.

* cited by examiner

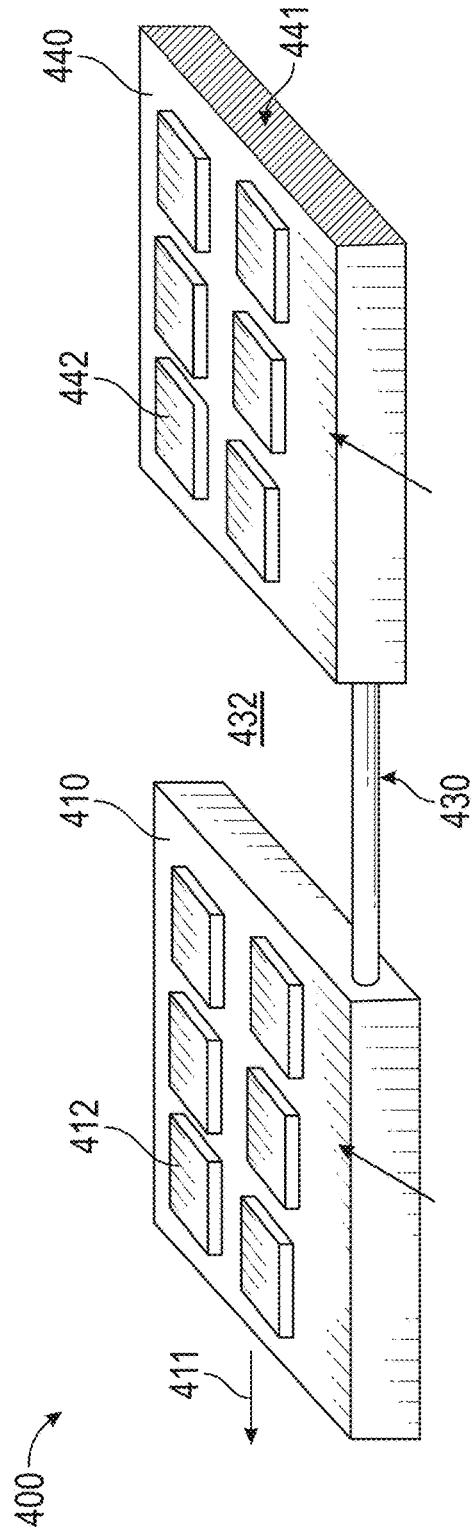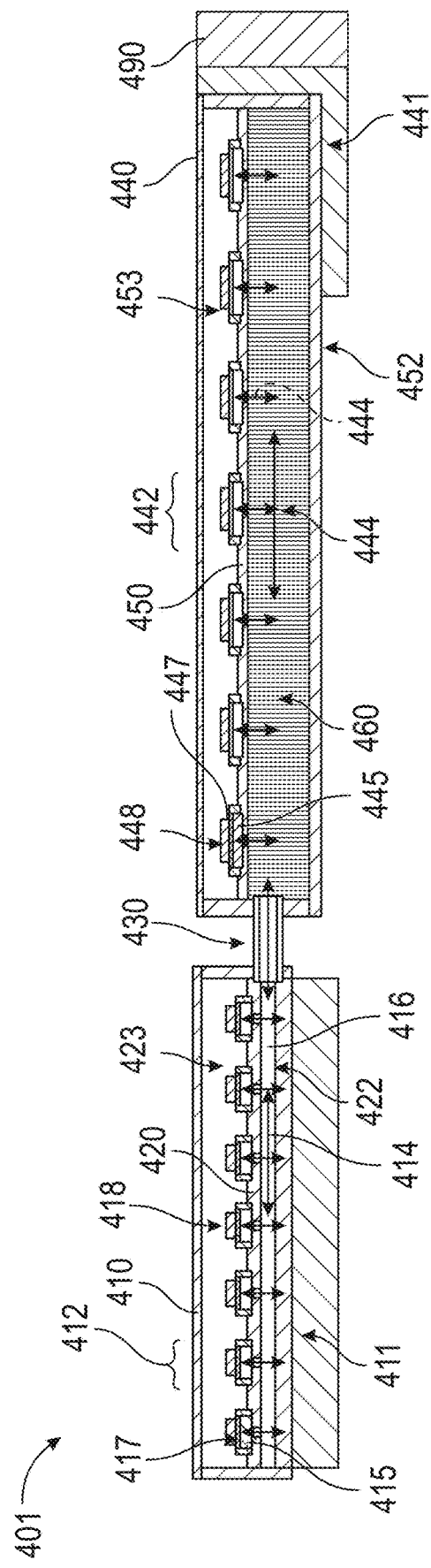
FIG. 4A
FIG. 4B

504

| P | Vp | Vrw | D | Vd | Vrc | Phase | |
|---|---|---|---|---|---|---|---|
| 1 | 1 | 0 | 1 | 0 | 1 | Compression 1 | |
| 0 | 1 | 0 | 1 | 0 | 1 | Compression 1 | |
| 0 | 0 | 1 | 1 | 0 | 1 | Compression 1 | |
| 1 | 0 | 1 | 1 | 0 | 1 | Compression 1 | a->b |
| 1 | 1 | 0 | 1 | 0 | 1 | Compression 2 | |
| 0 | 1 | 0 | 1 | 0 | 1 | Compression 2 | |
| 0 | 0 | 1 | 1 | 0 | 1 | Compression 2 | |
| 1 | 0 | 1 | 1 | 0 | 1 | Compression 2 | |
| 1 | 0 | 1 | 0 | 0 | 1 | Cold Displacement 1 | |
| 1 | 0 | 1 | 0 | 1 | 0 | Cold Displacement 1 | |
| 1 | 0 | 1 | 1 | 1 | 0 | Cold Displacement 1 | |
| 1 | 0 | 1 | 1 | 0 | 1 | Cold Displacement 1 | b->c |
| 1 | 0 | 1 | 0 | 0 | 1 | Cold Displacement 2 | |
| 1 | 0 | 1 | 0 | 1 | 0 | Cold Displacement 2 | |
| 1 | 0 | 1 | 1 | 1 | 0 | Cold Displacement 2 | |
| 1 | 0 | 1 | 1 | 0 | 1 | Cold Displacement 2 | |
| 0 | 0 | 1 | 0 | 1 | 1 | Expansion 1 | |
| 0 | 1 | 0 | 0 | 1 | 1 | Expansion 1 | |
| 1 | 1 | 0 | 0 | 1 | 1 | Expansion 1 | |
| 1 | 0 | 1 | 0 | 1 | 1 | Expansion 1 | c->d |
| 0 | 0 | 1 | 0 | 1 | 1 | Expansion 2 | |
| 0 | 1 | 0 | 0 | 1 | 1 | Expansion 2 | |
| 1 | 1 | 0 | 0 | 1 | 1 | Expansion 2 | |
| 1 | 0 | 1 | 0 | 1 | 1 | Expansion 2 | |
| 0 | 1 | 1 | 1 | 0 | 1 | Warm Displacement 1 | |
| 0 | 1 | 1 | 1 | 1 | 0 | Warm Displacement 1 | |
| 0 | 1 | 1 | 0 | 1 | 0 | Warm Displacement 1 | |
| 0 | 1 | 1 | 0 | 0 | 1 | Warm Displacement 1 | d->a |
| 0 | 1 | 1 | 1 | 0 | 1 | Warm Displacement 2 | |
| 0 | 1 | 1 | 1 | 1 | 0 | Warm Displacement 2 | |
| 0 | 1 | 1 | 0 | 1 | 0 | Warm Displacement 2 | |
| 0 | 1 | 1 | 0 | 0 | 1 | Warm Displacement 2 | |

FIG. 5D

MEMS CRYOCOOLER SYSTEMS AND METHODS

CROSS-REFERENCE TO RELATED APPLICATIONS

This application is a continuation of International Patent Application No. PCT/US2018/038821 filed Jun. 21, 2018 and entitled "MEMS CRYOCOOLER SYSTEMS AND METHODS," which is incorporated herein by reference in its entirety.

International Patent Application No. PCT/US2018/038821 filed Jun. 21, 2018 claims priority to and the benefit of U.S. Provisional Patent Application No. 62/524,318 filed Jun. 23, 2017 and entitled "MEMS CRYOCOOLER SYSTEMS AND METHODS", which is hereby incorporated by reference in its entirety.

TECHNICAL FIELD

One or more embodiments of the invention relate generally to cryogenic refrigeration devices and more particularly, for example, to microelectromechanical cryogenic refrigeration systems and methods.

BACKGROUND

Cryogenic refrigeration systems, or cryocoolers, are typically used to cool other devices to temperatures approaching or below approximately 120 Kelvin, and, more generally, can be used to cool devices to between 200 and 60 Kelvin, for example, depending on the overall heat load presented by a particular device. Such cooled devices are often one of a variety of different types of sensor systems that operate better (e.g., produce measurements with less noise, higher sensitivity, higher accuracy, higher responsiveness, and/or with other generally more desirable performance metrics) when cooled. For example, one such category of sensor systems that can benefit from being cooled includes infrared cameras (e.g., including a focal plane array (FPA) of individual infrared sensors), which measure or capture infrared (e.g., thermal) emissions from objects as infrared/thermal images and/or video. Cooling such infrared cameras generally increases detector sensitivity (e.g., by decreasing thermal noise intrinsic to the individual infrared sensors), which can result in overall more accurate and reliable infrared imagery.

Conventional mechanical cryogenic coolers are relatively large, costly to manufacture and maintain, and can be mechanically noisy, which can degrade performance of a coupled sensor system. Techniques to counteract mechanical vibration often undesirably increase cooler complexity and manufacturing cost. Miniature cryocooler designs are available, and some such designs employ microelectromechanical systems (MEMS) techniques, but to-date such conventional refrigerators provide relatively poor cooling power (e.g., a measure, typically in Watts, of the refrigerator's ability to extract heat from a coupled device) and cannot reach the temperatures desired for, for example, relatively low noise thermal imagery, when experiencing the thermal load typical of an operating infrared camera.

Thus, there is a need in the art for a compact, inexpensive, and reliable refrigerator or cryocooler with a relatively high cooling power sufficient to cool at least the FPA of an operating infrared camera to approximately cryogenic temperatures and/or to a temperature range approaching 200 to 60 Kelvin, or more narrowly, to a temperature range approaching 160 to 60 Kelvin or an approximate temperature of 77 Kelvin.

SUMMARY

Techniques are disclosed for systems and methods using microelectromechanical systems to provide cryogenic and/or general cooling of a device or sensor system. In one embodiment, a system may include a compressor assembly and a microelectromechanical systems (MEMS) expander assembly in fluid communication with the compressor assembly via a gas transfer line configured to physically separate and thermally decouple the MEMS expander assembly from the compressor assembly. The MEMS expander assembly may include a plurality of expander cells each including a MEMS displacer, a cell regenerator, and an expansion volume disposed between the MEMS displacer and the cell regenerator, and the plurality of cell regenerators may be configured to combine to form a contiguous shared regenerator for the MEMS expander assembly.

In another embodiment, a method includes forming a MEMS expander assembly and placing the MEMS expander assembly in fluid communication with a compressor assembly via a gas transfer line, where the gas transfer line is configured to physically separate and thermally decouple the MEMS expander assembly from the compressor assembly. The MEMS expander assembly may include a plurality of expander cells each including a MEMS displacer, a cell regenerator, and an expansion volume disposed between the MEMS displacer and the cell regenerator, and the plurality of cell regenerators may be configured to combine to form a contiguous shared regenerator for the MEMS expander assembly.

In a further embodiment, a method includes displacing at least a first portion of a working gas of a MEMS refrigerator into a MEMS expander assembly of the MEMS refrigerator, and expanding the working gas within the MEMS refrigerator using the MEMS expander assembly. The MEMS expander assembly may include a plurality of expander cells each including a MEMS displacer, a cell regenerator, and an expansion volume disposed between the MEMS displacer and the cell regenerator, and the plurality of cell regenerators may be configured to combine to form a contiguous shared regenerator for the MEMS expander assembly.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 4A-B illustrate a MEMS cryocooler in accordance with an embodiment of the disclosure.

Embodiments of the invention and their advantages are best understood by referring to the detailed description that follows. It should be appreciated that like reference numerals are used to identify like elements illustrated in one or more of the figures.

DETAILED DESCRIPTION

Figure 1A:
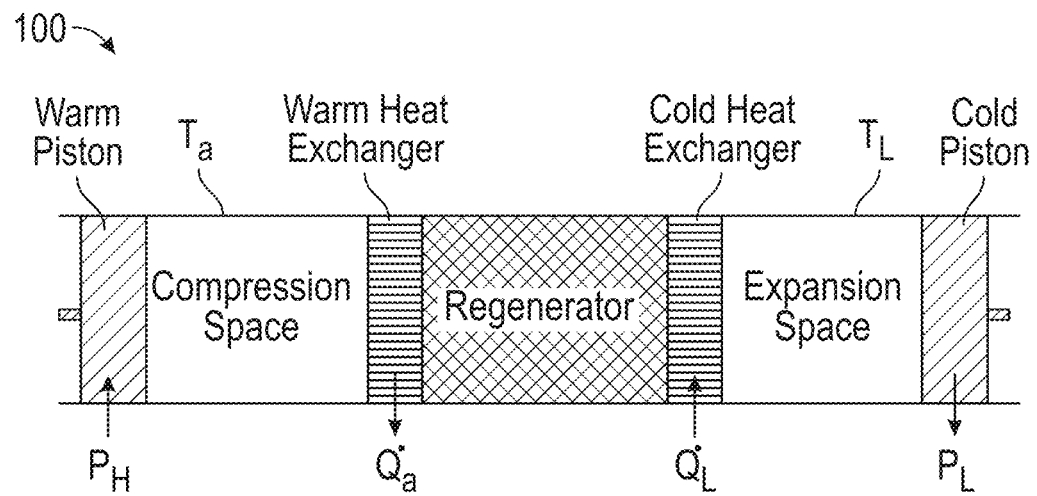
FIG. 1A illustrates a block diagram of a generic conventional Stirling refrigerator.

In accordance with various embodiments of the present disclosure, compact and powerful refrigeration systems and methods may advantageously employ a microelectromechanical systems (MEMS) cryocooler that includes a MEMS expander assembly with a substantially contiguous shared regenerator that is separated from a compressor assembly of the MEMS cryocooler by a gas transfer line. The gas transfer line is configured to allow gas to flow between the MEMS expander assembly and the compressor assembly and to thermally decouple the MEMS expander assembly from the compressor assembly sufficiently to allow the MEMS cryocooler to generate enough cooling power to cryogenically cool an operating sensor system thermally coupled to the MEMS expander assembly, such as an operating infrared camera.

The MEMS expander assembly may be implemented by a number of individual expander cells, each including its own MEMS displacer, expansion volume, and cell regenerator, which in aggregate form the MEMS expander assembly and the contiguous shared regenerator for the MEM expander assembly. By employing MEMS techniques, embodiments of the MEMS expander assembly may be manufactured relatively inexpensively and with high precision, thereby increasing the general manufacturing and operating efficiency and reliability of the MEMS cryocooler while generally reducing risk of detrimental mechanical interference with a coupled sensor system.

Because the individual cell regenerators and aggregate shared regenerator are integrated with and form part of the MEMS expansion assembly, the regenerator size is effectively independent of/decoupled from the size of the transfer tube and/or the compressor assembly, which allows the shared regenerator to be larger than regenerators of conventional MEMS refrigerators, and this helps embodiments of the present inventive MEMS cryocooler reach higher cooling powers and lower operating temperatures than similarly sized conventional systems, particularly when operated at similar input power (e.g., to operate the individual MEMS displacers and the compressor assembly). Moreover, because the MEMS expander assembly and its integrated shared regenerator are thermally decoupled from the compressor assembly by the transfer tube, heat leak from the compressor assembly to the MEMS expansion assembly is relatively low, as compared to conventional MEMS refrigerators, which further increases the cooling power (and lowers the achievable operating temperature) of the present MEMS cryocooler.

In some embodiments, the compressor assembly may be implemented by a conventional mechanical compressor and/or a linear compressor. In other embodiments, the compressor assembly may be a MEMS compressor assembly implemented by a number of individual compressor cells, each including its own MEMS compressor, compression volume, and gas channel cavity, which may be roughly similar in structure to the expander cells. When employing such MEMS techniques, the MEMS compressor assembly, and the MEMS cryocooler as a whole, may benefit similarly as described with respect to the MEMS expander assembly.

Because embodiments of the present disclosure provide relatively high cooling powers and low operating temperatures, coupled cooled sensor systems may be made to operate better than with conventional MEMS refrigerators and/or mechanical cryocoolers, particularly where compactness and efficiency are at a premium, such as in applications involving spaceflight, unmanned aircraft systems, relatively large and/or high power-dissipating sensor systems, and/or battery or solar powered systems. In particular, higher cooling powers and/or lower operating temperatures can, be beneficial to operation of infrared cameras.

For example, infrared cameras may be used for nighttime or other applications when ambient lighting is poor or when environmental conditions are otherwise non-conducive to visible spectrum imaging, and may also be used for applications in which additional non-visible-spectrum information about a scene is desired, such as for gas leak detection. In each application, it is typically desirable to reduce noise and variability in images captured by the infrared camera by cooling at least a focal plane array (FPA) of the infrared camera to a cryogenic and/or relatively stable temperature while the images are captured. It is also typically desirable to minimize mechanical vibration and/or interference with operation of the infrared camera. The higher cooling powers provided by embodiments of the present disclosure can cool larger and/or more power dissipative FPAs (e.g., higher performance FPAs), for example, and/or can provide lower and more stable operating temperatures; lower operating temperatures result in lower noise in resulting infrared imagery, and more stable operating temperatures result in more reliable and accurate infrared images (e.g., in particular, thermal images). Embodiments are also generally more efficient than conventional systems and can reach similar cooling powers with more restrictive cryocooler volume, weight, and/or power usage limits.

Figure 1B:
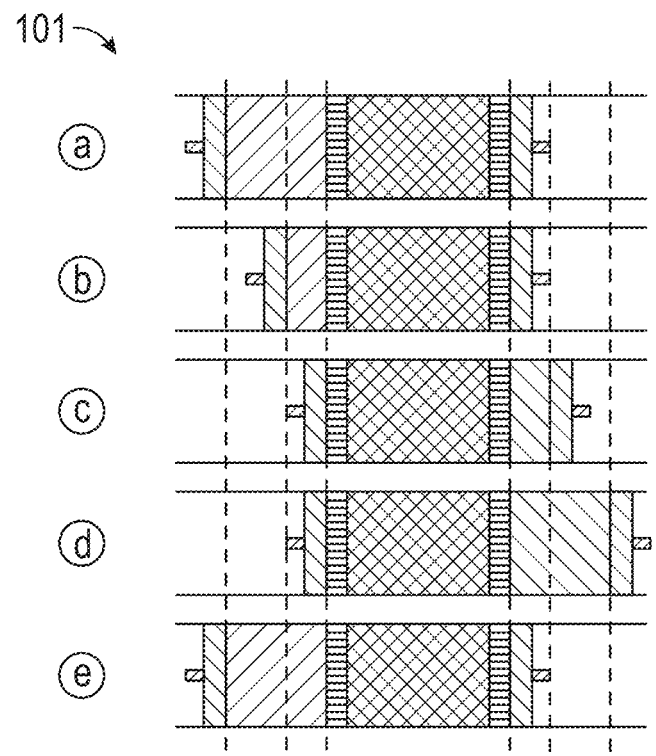
FIG. 1B illustrates a Stirling cycle for the generic conventional Stirling refrigerator of FIG. 1A.

Embodiments of the present MEMS cryocooler may employ a cooling cycle similar to that used by a conventional Stirling refrigerator. For example, FIG. 1A illustrates a block diagram of a generic conventional Stirling refrigerator 100, and FIG. 1B illustrates a Stirling cycle for generic conventional Stirling refrigerator 100 of FIG. 1A. As shown in FIG. 1A, Stirling refrigerator 100 includes a warm piston operating to compress gas within the compression space and an adjacent warm heat exchanger to extract heat in the gas generated at least in part by the compression (for effectively isothermal compression), a regenerator to store and release heat from and to the gas as it travels through the regenerator (for isochoric displacement), a cold piston operating to expand the gas within the expansion space and an adjacent cold heat exchanger to extract heat from the environment and provide it to the expanded gas (for effectively isothermal expansion). The closer the system operates to purely isothermal and/or isochoric ideals, the more efficient the system is overall.

As shown in FIG. 1B, a typical Stirling cycle for Stirling refrigerator 100 includes the warm piston and the cold piston moving according to the series of states a, b, c, and d of FIG. 1B, and then back to state a to start the Stirling cycle again. The result of moving through the states as shown in FIG. 1B is that heat from a heat source thermally coupled to the cold heat exchanger is transferred from the cold heat exchanger to the warm heat exchanger, where it is then deposited into a thermal sink (e.g., typically the environment) coupled to the warm heat exchanger. For example, heat from a sensor system coupled to the cold heat exchanger may be transferred to a radiator radiating the heat into the atmosphere by applying input power to operate the warm and cold pistons as shown in FIG. 1B. One measure of the electrical efficiency of the refrigerator is the ratio of the cooling power of the refrigerator to the input electrical power, which can be averaged over a period of time.

In the conventional Stirling refrigerator of FIGS. 1A-B, the regenerator is shown as stationary throughout the Stirling cycle, which simplifies operation and manufacture but requires the cold piston to be mobile at the coldest temperatures. For large scale mechanical Stirling cryocoolers, it can be difficult to manufacture a piston that can reliably operate at such cold temperatures without risking leaks of the working gas from the cold side of the refrigerator. So, in many large scale mechanical Stirling refrigerators, the regenerator is coupled to a reciprocating rod driven by a mechanical system on the warm side of the refrigerator (with relatively reliable warm gas seals throughout) that moves the regenerator within the Stirling refrigerator to alternatingly expand and contract the expansion space as against an unmoving cylinder base (e.g., to reproduce the series of states from state b to d to expand or create the expansion space and then to state a to contract or extinguish the expansion space).

The regenerator in FIG. 1A is an important part of Stirling refrigerator 100, is a fundamental part of any Stirling refrigerator, and is distinguished from the warm and cold heat exchangers both in how it is used within Stirling refrigerator 100 and in how it is situated within Stirling refrigerator 100. As noted above, the regenerator acts primarily to extract and store heat from within the gas as it travels from the hot side of Stirling refrigerator 100 to the cold side of Stirling refrigerator 100, and then to deliver that same heat back to the gas as it travels from the cold side of Stirling refrigerator 100 to the warm side of Stirling refrigerator 100. The larger the stored heat flux, and the closer the extracted/stored heat flux and the delivered heat flux are to being the same, the more efficient Stirling refrigerator 100 is, and the higher the cooling power Stirling refrigerator 100 generates (e.g., the measure of how much heat Stirling refrigerator 100 can transfer from the cold heat exchanger to the warm heat exchanger, per unit time).

From this basic tenants, an (impossibly) ideal regenerator should have a large volumetric heat capacity (in order to be able to store a relatively large amount of heat), provide perfect heat contact with the gas as it travels through the regenerator, provide zero flow resistance to the gas, have zero porosity, and have zero thermal conductivity in the gas flow direction. By contrast, an ideal heat exchanger should have very high/infinite thermal conductivity in all directions, including in the gas flow direction, and it does not need to have a large volumetric heat capacity—a heat exchanger acts solely to transfer heat through the body of the heat exchanger material to a thermal sink, not to store heat within the body of the material.

In addition, the regenerator of Stirling refrigerator 100 ideally should also be completely thermally decoupled from the environment (e.g., the warm and cold heat exchangers, and/or any other part of Stirling refrigerator 100) and only thermally interact with the working gas of Stirling refrigerator 100. By contrast, the warm and cold heat exchangers of Stirling refrigerator 100 function to thermally link the working gas to the environment (e.g., the atmosphere or other thermal sink, and a sensor system or other thermal source, both external to the fundamental structure of Stirling refrigerator 100). No real system is perfectly ideal, and so in real refrigerators there is some non-ideal stray thermal coupling between the regenerator and other structures of Stirling refrigerator 100, but this stray thermal coupling does not act to convert the regenerator into a heat exchanger, and the structure referred to herein as a regenerator is fundamentally different from a conventional heat exchanger, at least for the reasons provided above.

Figure 2:
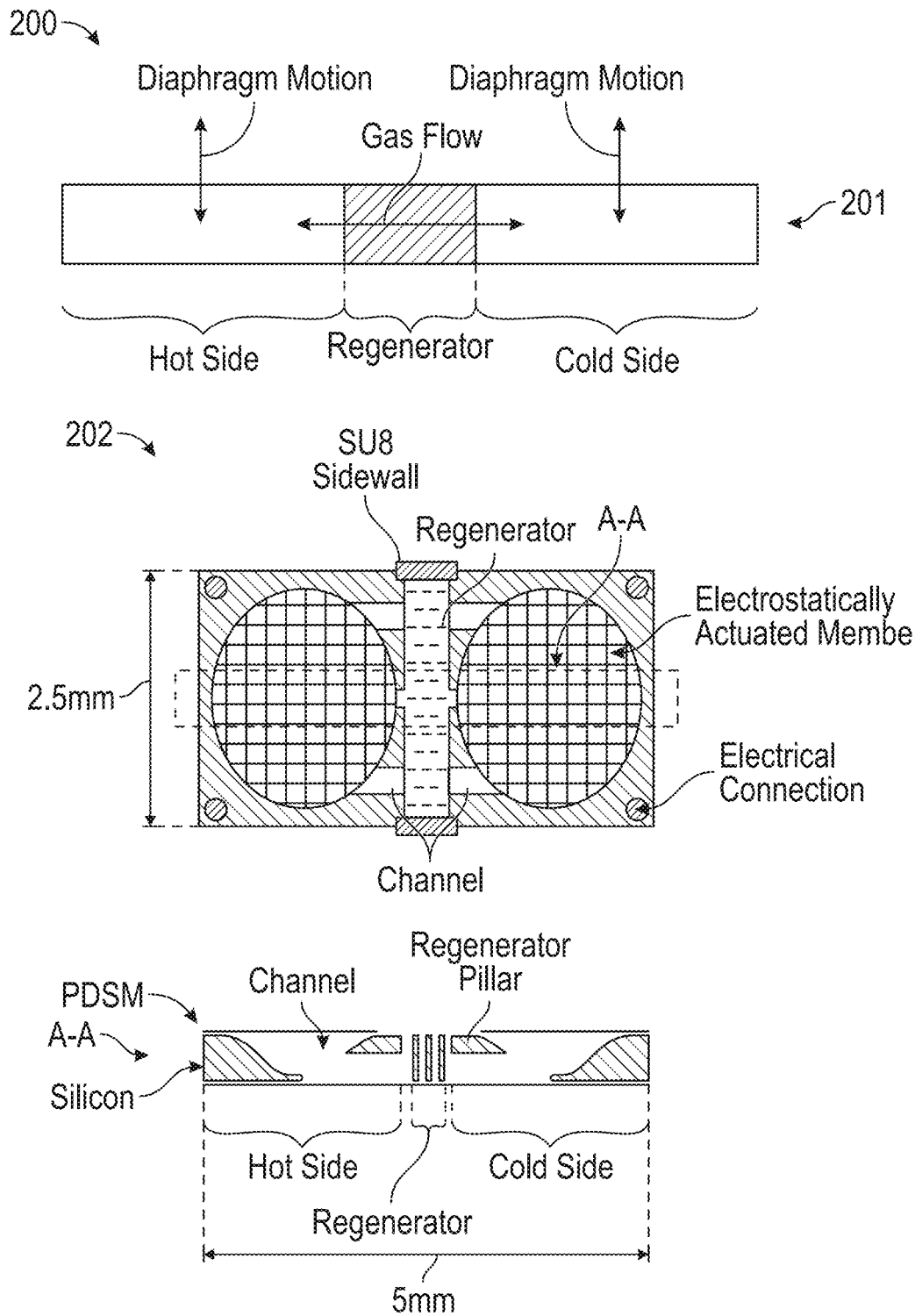
FIG. 2 illustrates a first conventional microelectromechanical system (MEMS) based Stirling refrigerator.

Various MEMS structures have been used to form MEMS refrigerators similar to the conventional Stirling refrigerator 100. For example, FIG. 2 illustrates various representations of a first conventional MEMS based Stirling refrigerator 200. Diagram 201 is a general block diagram of a side view of conventional MEMS based Stirling refrigerator 200 that shows its similarity to conventional Stirling refrigerator 100, with a central stationary regenerator and two MEMS diaphragms acting as the warm and cold pistons, as shown. Diagram 202 shows a top view of conventional MEMS based Stirling refrigerator 200, which illustrates how the relatively small (in volume and in length along the direction of gas flow) regenerator for conventional MEMS based Stirling refrigerator 200 lies between the compression and expansion spaces and partially within a gas channel connecting the two spaces. Diagram A-A shows a side section view along rectangular cut A-A in diagram 202, which again shows the minimal volume for the regenerator of conventional MEMS based Stirling refrigerator 200.

Figure 3A:
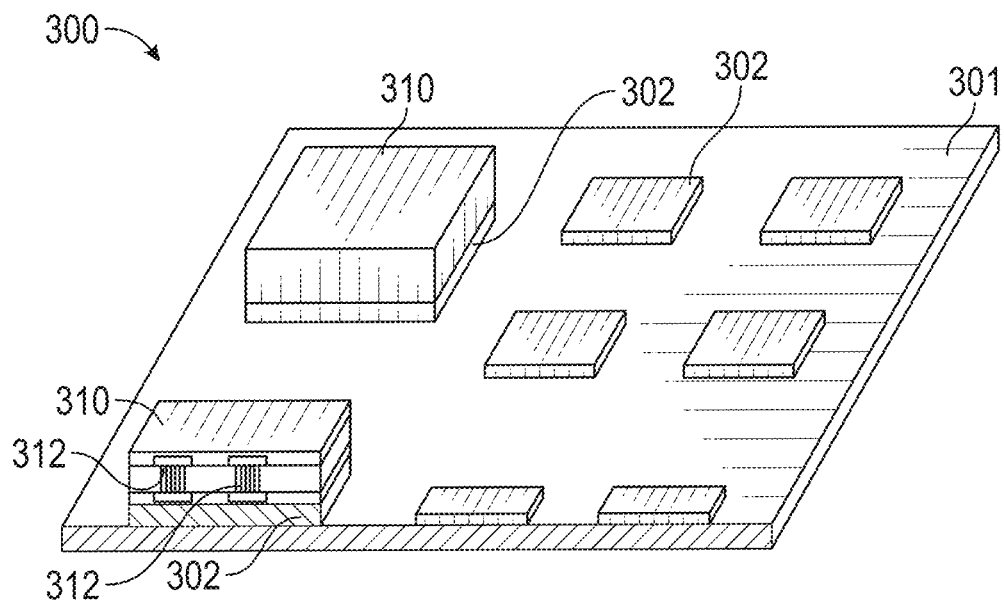
FIGS. 3A-B illustrate a second conventional MEMS based Stirling refrigerator.
Figure 3B:
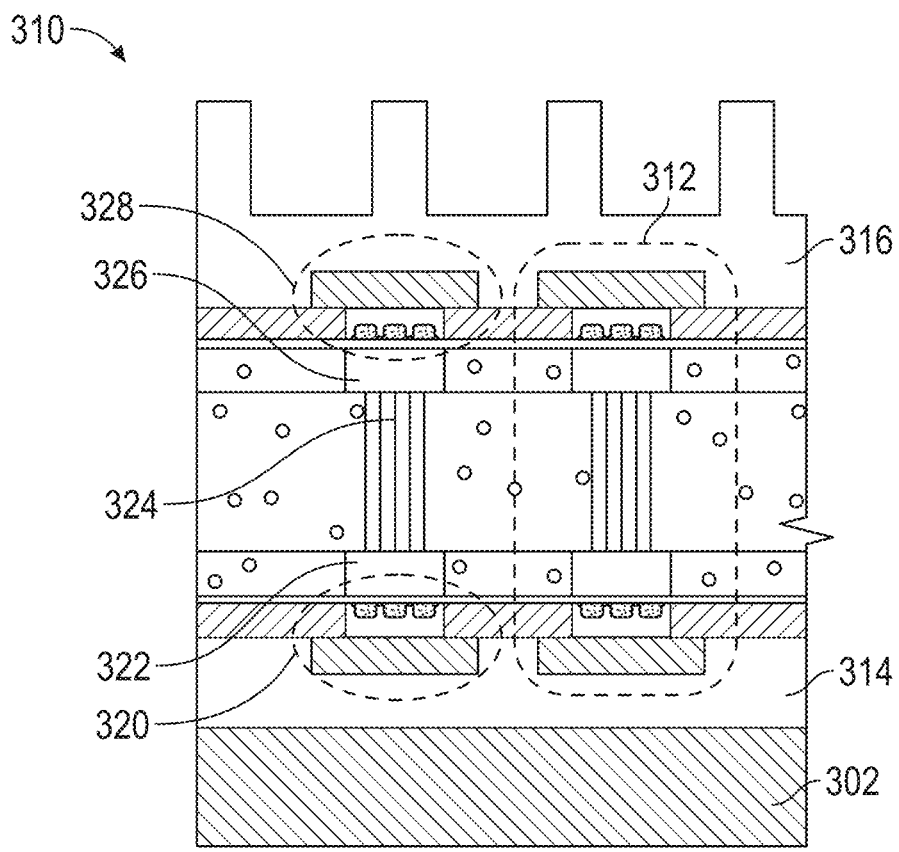

FIGS. 3A-B illustrate a second conventional MEMS based Stirling refrigerator 300. FIG. 3A shows two microcooler arrays 310 situated atop chips 302 in circuit board 301, where each microcooler array 310 includes a number of individual MEMS based vertical Stirling refrigerators 312. FIG. 3B shows a blow up of microcooler array 310 atop chip 302, including multiple MEMS based Stirling refrigerators 312. As shown in FIG. 3B, each MEMS based Stirling refrigerator 312 includes a single expander actuator 320 and expansion space 322 coupled to a single compressor actuator 328 and compressor space 326 through an individual regenerator 324 disposed entirely physically between the expansion space 322 and compressor space 326. Metal layer heat exchanger 314 extracts heat from chip 302 and delivers it to gas in expansion spaces 322 and metal layer heat exchanger 316 extracts heat from gas in compression spaces 326 and delivers it to the environment, similar to conventional Stirling refrigerator 100 of FIG. 1A. Notably, each regenerator 324 is separate from all other regenerators 324 in microcooler array 310, which limits their individual volumes, each regenerator is relatively short along the direction of gas flow (e.g., vertically as shown in FIG. 3B), and each regenerator cross section is limited to approximately the width of the single compression and expansion spaces 322 and 326, all of which act to limit the available size of regenerator 324 and, thereby, the achievable cooling power of microcooler array 310.

In each of the conventional MEMS based Stirling refrigerators 200 and 300, the proximity of the warm and cold ends of the refrigerators generates elevated heat conduction losses resulting in a substantial loss in refrigerator efficiency. By contrast, longer distances between the warm and cold ends reduces such losses and increases the refrigerator efficiency, and such longer distances are often necessary to reach cryogenic temperatures in the presence of any appreciable heat load. In particular, the refrigerator structures shown in FIGS. 2 and 3A-B are typically unable to generate cryogenic cooling, at least because their basic structure cannot easily be modified to increase the effective volume and function of their respective regenerators. The effectiveness of a regenerator is highly dependent on its length along the flow direction of the working gas, its gas contact surface area, and its mass (e.g., mass is generally proportionally related to its ability to store heat). The refrigerator designs shown in FIGS. 2 and 3A-B leave relatively little space and gas-flow length for the regenerator, and modifying their designs simply to increase their respective regenerator sizes, for example, would introduce other design flaws (e.g., pumping volume relative to regenerator volume) that would further degrade their ability to act as refrigerators. Moreover, simply increasing their size would not result in an appreciable increase in cooling power. As such, the refrigeration efficiency and cooling power for such designs are relatively very small. This is true even for larger arrays of such structures, because the cooling power to input power ratio for these structures does not change by adding additional array elements.

Embodiments of the present MEMS cryocooler address these efficiency and cooling power issues by providing a MEMS expander assembly separated from a compressor assembly by a gas transfer line that acts to thermally decouple the MEMS expander assembly from the compressor assembly at least by allowing the two assemblies to be formed/placed/spaced relatively far apart from each other, thereby limiting the heat leak between the warm compressor assembly and the cold MEMS expander assembly. In addition, the MEMS expander assembly is implemented by a plurality of expander cells, each with its own cell regenerator, and where the plurality of cell regenerators are arranged to form a shared regenerator for the entire MEMS expander assembly that spans roughly the footprint of the entire MEMS expander assembly, or at least the aggregate footprint of the plurality of expander cells. Such arrangement allows the shared regenerator to have a size and shape that is substantially decoupled from the size and shape of the compressor assembly, and, moreover, allows the shared regenerator to be relatively large, thereby increasing the achievable cooling power for the MEMS cryocooler, as described herein.

FIGS. 4A-B illustrate a MEMS cryocooler in accordance with an embodiment of the disclosure. In particular, FIG. 4A shows an external perspective view of a MEMS cryocooler 400 including a MEMS compressor assembly 410 physically spaced and thermally decoupled from a MEMS expander assembly 440 by a gas transfer line 430, such that only gas transfer line 430 (e.g., and possibly a common substrate or support structure) physically links MEMS compressor assembly 410 and MEMS expander assembly 440 across space 432. As such, gas transfer line 430 places MEMS expander assembly 440 in fluid communication with MEMS compressor assembly 410. As shown in FIG. 4A, MEMS compressor assembly 410 includes a plurality of individual compressor cells 412 and MEMS expansion assembly includes a plurality of individual expander cells 442. MEMS cryocooler 400 generates a heat flow from right to left, accepting heat at cold interface 441 (e.g., from a sensor system coupled to MEMS cryocooler 400) and expressing heat at warm interface 411 (e.g., from MEMS cryocooler 400 to a radiator or other thermal sink). Each of MEMS compressor assembly 410 and MEMS expander assembly 440 may include any number of compressor or expander cells, including a differing number of cells. In various embodiments, the plurality of compressor cells 412 may be arranged substantially in a plane relative to one another, and the plurality of expansion cells 442 may be arranged substantially in a plane relative to each other.

Although shown in FIG. 4A as a tube, gas transfer line 430 may be implemented as a channel or other structure configured to convey working gas between MEMS compressor assembly 410 and MEMS expander assembly 440 and to provide thermal decoupling and/or distance between MEMS compressor assembly 410 and MEMS expander assembly 440. In some embodiments, MEMS compressor assembly 410, MEMS expander assembly 440, and/or gas transfer line 430 may be formed on a single substrate using common MEMS fabrication techniques. In other embodiments, each of MEMS compressor assembly 410, MEMS expander assembly 440, and gas transfer line 430 may be formed separately and coupled together to form MEMS cryocooler 400. In still further embodiments, MEMS cryocooler 400 may be implemented with a conventional compressor and/or gas transfer line in place of MEMS compressor assembly 440 and gas transfer line 430, for example, and only MEMS expander assembly 440 is formed using MEMS techniques.

FIG. 4B shows a cross section internal view of a MEMS cryocooler 401 including MEMS compressor assembly 410 spaced and thermally decoupled from MEMS expander assembly 440 by gas transfer line 430. As shown in FIG. 4B, MEMS compressor assembly 410 includes a plurality of compressor cells 412 each including a compression volume 415 (e.g., a compression cell volume) and a MEMS compressor 417 (e.g., a flexible diaphragm or other MEMS actuated structure) actuated by a MEMS actuator 418. Also shown in MEMS compressor assembly 410 are bi-directional gas flow 414 through shared gas channel 416 and into and out of compression volumes 415, warm heat exchanger 420, and compressor housing 422. In various embodiments, compressor cells 412 may each include a portion of shared gas channel (e.g., a cell gas channel). In the embodiment shown in FIG. 4B, compressor housing 422 encloses back space 423, which may be gas filled in order to facilitate thermal transport between the various structures within MEMS compressor assembly 410 and to provide appropriate back pressure to MEMS compressors 417 to facilitate operation of MEMS compressors 417. Functionally, warm heat exchanger 420, gas within back space 423, and compressor housing 422 operate to extract heat from gas within compression volume 415 and shared gas channel 416 and transfer the extracted heat to warm interface 411, which may in turn be coupled to a thermal sink, such as an atmospheric radiator and/or a cool water reservoir, for example.

Also as shown in FIG. 4B, MEMS expander assembly 440 includes a plurality of expander cells 442 each including an expansion volume 445 and a MEMS displacer 447 (e.g., a flexible diaphragm or other MEMS actuated structure) actuated by a MEMS actuator 448. Also shown in MEMS expander assembly 440 are bi-directional gas flow 444 through shared regenerator 460 and into and out of expansion volumes 445, cold heat exchanger 450, and expander housing 452. In the embodiment shown in FIG. 4B, expander housing 452 encloses back space 453, which may be gas filled in order to facilitate thermal transport between the various structures within MEMS expander assembly 440 and to provide appropriate back pressure to MEMS displacers 447 to facilitate operation of MEMS displacers 447. Functionally, cold heat exchanger 450, gas within back space 453, and expander housing 452 operate to transfer heat from cold interface 441, which may in turn be coupled to a thermal source, such as an electronic device 490, for example, to gas within compression volume 415 and shared gas channel 416. Electronic device may be a sensor system or part of a sensor system, for example, such as an FPA and/or other structure of an infrared camera. Notably, gas transfer tube 430 does not include any regenerator matrix, which allows gas transfer tube to be relatively narrow, which, along with its length, can help reduce heat leak from compressor assembly 410 to MEMS expander assembly 440.

As with MEMS cryocooler 400, in some embodiments, MEMS cryocooler 401 may be implemented with a conventional compressor and/or gas transfer line replacing MEMS compressor assembly 410 and/or gas transfer line 430. In alternative embodiments, most or all the structures of MEMS cryocooler 401 may be formed using a common MEMS fabrication process to build up structures of MEMS cryocooler 401 upon a common substrate. For example, MEMS actuators 418 and/or 448 may both be implemented by piezoelectric actuators (e.g., a PZT (Pb[Zr,Ti] O3) based design or other piezo based systems), moving coil motors, moving magnet motors, and/or other MEMS actuators, which may be the same or different across each of MEMS compressor assembly 410 and/or expander assembly 440. Typically, such actuators are a few micrometers in diameter.

In general, MEMS expander assembly 440 may be implemented as a multi-stage system including a series of expander cells 442 interconnected by shared regenerator 460 and gas channels between each expansion volume 445 and shared regenerator 460. Each expander cell 440 generates its own incremental cooling power, which can be used to cool a specific portion of MEMS expander assembly 440 and/or, in aggregate, to cool electronic device 490 coupled to cold interface 441. The cooling power is generated by changing the volume of expansion volumes 445 according to a typical thermodynamic Stirling cycle, such as that described with reference to FIG. 1B. For example, MEMS actuator 448 of MEMS displacer 447 determines phase shift, timing, and magnitude of the changes to expansion volume 445 relative to system pressure and mass flow (e.g., generated by MEMS compressor assembly 410).

To achieve optimum expander performance, the modulation of expansion volumes 445 can be optimized for each expander cell 442 individually. This is beneficial as temperature and other boundary conditions are changing along the temperature gradient, which is an integral result of temperature drops from expander cell to expander cell (e.g., from left to right). A cooled electronic device 490 can be attached to the coldest location on MEMS expander assembly 440, such as cold interface 441 as shown in FIG. 4B, or electronic device 490 or portions of electronic device 490 (e.g., power leads, larger mass components, and/or other portions) may be attached at other locations at higher temperatures, for example. In particular, shared regenerator 460 has a substantially higher efficiency relative to prior art designs. For example, shared regenerator 460 has: a relatively large mass, volume, and surface area for a given expander envelope; a relatively large hydraulic diameter, resulting in reduced gas pressure losses; a relatively large regenerator length along the direction of gas flow, resulting in reduced conduction losses along the length of shared regenerator 460.

In general, MEMS compressor assembly 410 may be implemented by a plurality of compressor cells 412, which may be configured to simultaneously compress and displace/expand gas located within the working space of MEMS cryocooler 401. Gas gets pumped into MEMS expander assembly 440 by reducing compressor volumes 415 of all compressor cells 412. Increasing compressor volumes 415 generates a reverse effect. The total mass flows generated by compressor cells 412 get merged and pumped through shared gas channel 416 into (or from) MEMS expander assembly 440. Most of the heat of compression is removed at MEMS compressor assembly 410, as is typical a Stirling refrigerator. Gas transfer line 430 thermally decouples/insulates—at least partially—MEMS compressor assembly 410 from MEMS expander assembly 440, and this helps to reduce heat transfer to MEMS expander assembly 440. MEMS actuator 418 of MEMS compressor 417 determines phase shift, timing, and magnitude of the changes to compression volume 415 to generate system pressure and mass flow.

One basic difference between a generic conventional Stirling refrigerator, as shown in FIG. 1A, and a MEMS cryocooler is the size of the compression and expansion volumes. The relatively small compression and expansion volumes of a MEMS cryocooler would substantially limit its cooling power if operated at the same frequency as a generic conventional Stirling refrigerator, and so a MEMS cryocooler may be operated at frequencies approximately ten times that of a generic conventional Stirling refrigerator, such as at 600 Hz vs. 60 Hz, for example. In addition, however, the relatively large gas volume of shared regenerator 460 can require increased compression and expansion volumes, which can exceed the changes in volume easily achieved by simple MEMS actuated compressors and expanders (e.g., actuated flexible diaphragms). Increasing only the operating frequency is typically not sufficient to fully compensate for the reduced compression to regenerator volume ratio, which can result in a reduced pressure ratio and a reduced overall cooling power. One way to address this issue is to incorporate buffer volume assemblies within the compressor/expander cells in order to increase their effective compression/expansion volumes, as described more fully herein.

Figure 5A:
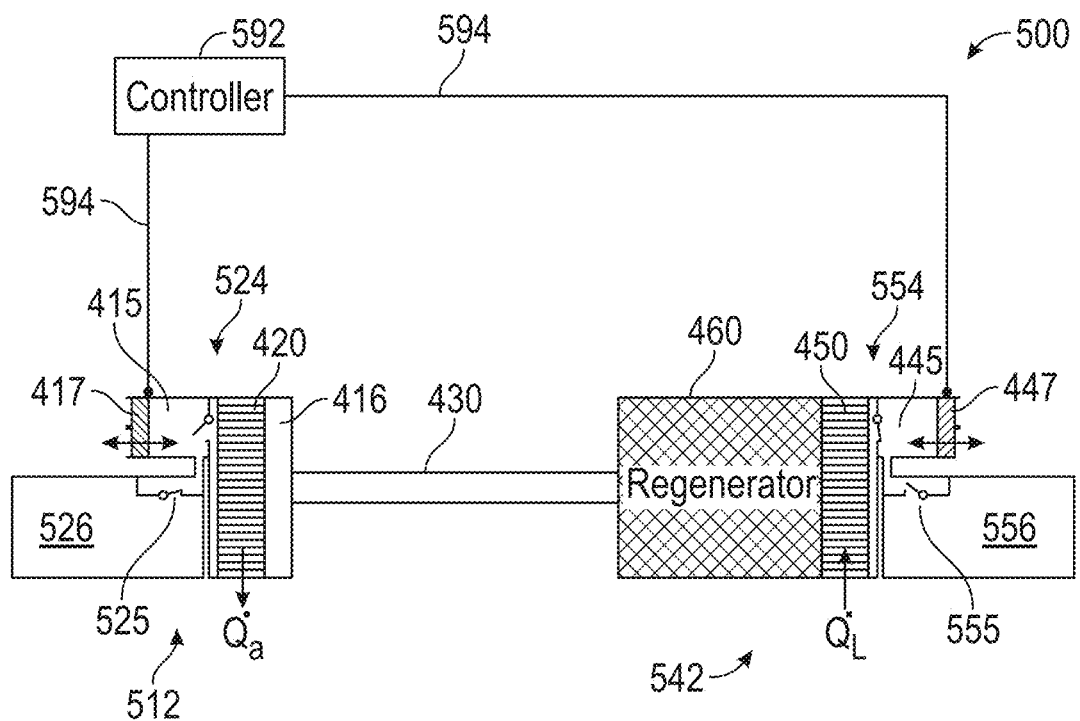
FIG. 5A illustrates a block diagram of a MEMS cryocooler including a compressor cell buffer volume and an expander cell buffer volume in accordance with an embodiment of the disclosure.

FIG. 5A illustrates a simplified block diagram of a MEMS cryocooler 500 including a compressor cell buffer volume 526 and an expander cell buffer volume 556 in accordance with an embodiment of the disclosure. In FIG. 5A, compressor cell 512 includes all the features of compressor cell 412 of FIG. 4B, but additionally incorporates a compressor buffer volume assembly including a compressor valve 524 between compression volume 415 and warm heat exchanger 420 and/or shared gas channel 416, a buffer volume valve 525, and a buffer volume 526. Likewise, expander cell 542 includes all the features of expander cell 412 of FIG. 4B, but additionally incorporates an expander buffer volume assembly including an expander valve 554, a buffer volume valve 555, and a buffer volume 556. Typically, MEMS cryocooler 500 includes multiples of both compressor cell 512 and expander cell 542.

In various embodiments, MEMS cryocooler 500 may include controller 592 electrically coupled to compressor cell 512 and expander cell 542 through control lines 594 and configured to provide control signals over control lines 594 to control operation of at least MEMS compressor 417, MEMS displacer 447, compressor valve 524, expander valve 554, and buffer volume valves 525 and 555, and/or other elements of MEMS cryocooler 500. Controller 592 may be implemented as a monolithic device, as shown in FIG. 5A, or may be implemented as a selection of distributed microcontrollers each controlling operation of one or more of MEMS compressor cells 512 and/or MEMS expander cells 542. In such distributed embodiments, each microcontroller may be implemented with sensors and/or sensor interfaces to monitor operation of one or more cells and adjust operation of the one or more cells to, for example, halt operation in the event of detected damage or poor performance (e.g., close off compressor/expander/buffer volumes from the remainder of the respective compressor cell/expander cell assembly), increase or decrease a cooling power (e.g., by adjusting a phase of cell and/or assembly operation relative to other elements of MEMS cryocooler 500), and/or otherwise adjust an operating temperature or performance of MEMS cryocooler 500. In various embodiments, controller 592, whether realized as a monolithic device and/or as a selection of distributed microcontrollers, may be implemented with one or more logic and/or analog devices, circuits, and/or circuit elements configured to control and/or sense operation of one or more of MEMS compressor cell 512, MEMS compressor assembly 410, MEMS expander cell 542, and/or MEMS expander assembly 440, as described herein.

Valves 524, 525, 554, and 555 may in some embodiments be implemented as MEMS valves, for example, as described more fully herein. For example, valves 524, 525, 554, and 555 may be implemented by piezoelectric actuators (e.g., a PZT (Pb[Zr,Ti] O3) based design or other piezo based systems), moving coil motors, moving magnet motors, and/or other MEMS actuators, which may be the same or different across each of MEMS compressor assembly 410 and/or expander assembly 440.

In general, the effective compression (and expansion) volumes for MEMS cryocooler 500 can be increased relative to MEMS cryocooler 401 by adding valves 524, 525, 554, and 555, and buffer volumes 526 and 556, to one or more of compressor cells 512 and/or expander cells 542, as shown. Gas compression towards a maximum target pressure may be accomplished by multiple actuations of MEMS compressor 417 while gas is moved from buffer volume 526 into the compression space (e.g., compressor volume 415, shared gas channel 416, gas transfer line 430, and/or expander cell 542). During an expansion process, working gas may be collected from the compression space and pumped into buffer volume 556.

Figure 5B:
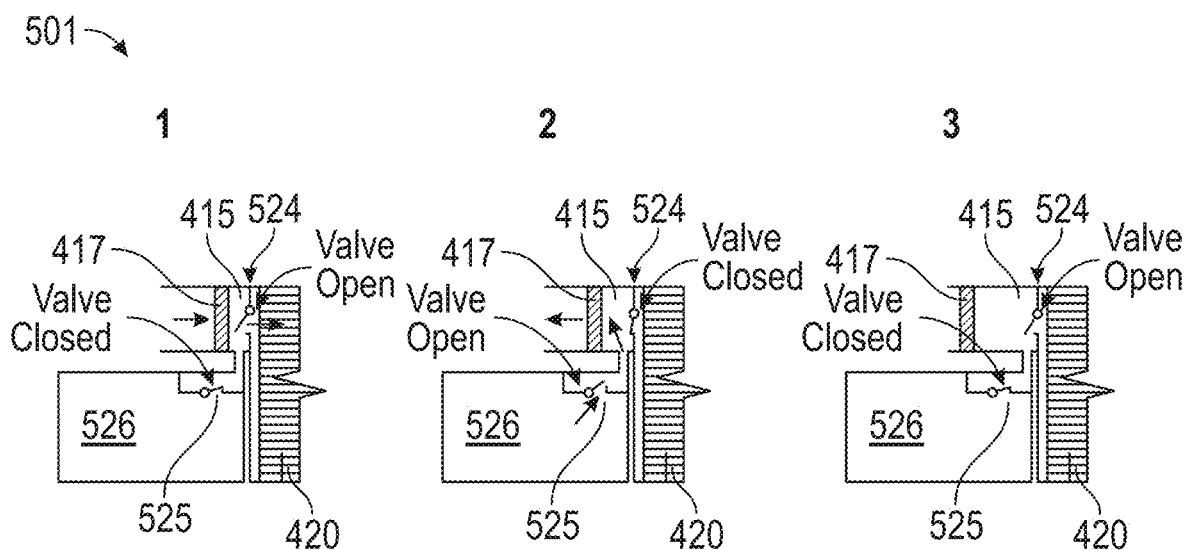
FIG. 5B illustrates a compression sub-cycle for a MEMS cryocooler including a compressor cell buffer volume in accordance with an embodiment of the disclosure.

FIG. 5B illustrates a compression sub-cycle for a MEMS cryocooler including a compressor cell buffer volume in accordance with an embodiment of the disclosure. During phase 1, compressor valve 524 is opened and buffer volume valve 525 is closed. Gas gets moved by MEMS compressor 417 into the rest of MEMS cryocooler 500 after passing through warm heat exchanger 420. The pressure increases by a certain amount while a portion of the compression heat is released to the environment. During phase 2, compressor valve 524 is closed and buffer volume valve 525 is opened. MEMS compressor 417 moves the opposite direction to draw gas from buffer volume 526 into compression volume 415. During phase 3, buffer volume valve 525 closes once MEMS compressor 417 has reached the fully open position and compressor valve 524 opens to ready the system to move back to phase 1. The whole cycle is repeated until the peak desired gas pressure in the compression space has been reached. The process is reversed to pump working gas back into buffer volume 526 during the substantially isochoric gas displacement from expander cell 542 to compressor cell 512 (e.g., corresponding to the transition from step d to step a in FIG. 1B). A similar process is performed with a buffer volume assembly of expander cell 542 to expand and cool working gas by pumping it into buffer volume 556 and then to displace gas back to compressor cell 512 by pumping the gas out of buffer volume 556.

In general, incremental gas removal from expansion volume 445 into buffer volume 556 increases the effective expansion volume analogous to the gas compression process described with reference to FIG. 5B. MEMS compressor 417 and MEMS displacer 447 are typically moving (nearly) sinusoidally (though with a phase difference) inside MEMS cryocooler 500. This is typically the most efficient method to operate a resonant running compressor assembly and a phase shifted expander assembly. However, MEMS cryocooler 500 equipped with compressor/expander buffer volume assemblies works differently. MEMS cryocooler 500 works at two frequencies: a valve switching frequency based on the number of pumping or displacement cycles required for reaching maximum gas pressures and displacement volumes within a particular period of time; and a Stirling cooler cycle frequency.

Figure 5C:
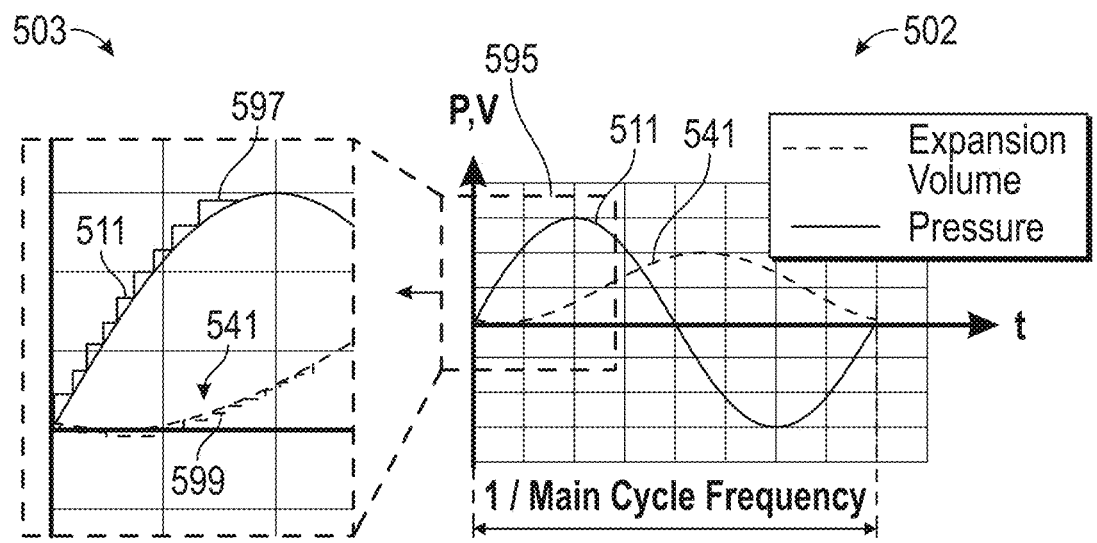
FIG. 5C illustrates graphs of a compression cycle and an expansion cycle for a MEMS cryocooler including a compressor cell buffer volume and an expander cell buffer volume in accordance with an embodiment of the disclosure.

FIG. 5C illustrates graphs of a compression cycle and an expansion cycle for MEMS cryocooler 500 including compressor cell buffer volume 526 and expander cell buffer volume 556 in accordance with an embodiment of the disclosure. In particular, graph 502 shows a sinusoidal pressure 511 and an effective expansion volume 541, as functions of time, plotted for a full Stirling cooling cycle. Inset 595 is reproduced as graph 503, which shows detail illustrating how compressor and expander buffer volume assemblies of compressor cell 512 and expander cell 542 generate sinusoidal pressure 511 and effective expansion volume 541 over time, with respective steps 597 and 599 showing how, for example, gas from buffer volume 526 is incrementally accumulated through action of compressor valve 524 and buffer volume valve 525 to generate a relatively high peak pressure, and the same gas is incrementally drawn into buffer volume 556 through action of expander valve 554 and buffer volume valve 555 to generate a relatively large peak expansion volume, even when both are coupled to relatively voluminous regenerator 460.

Figure 5D:
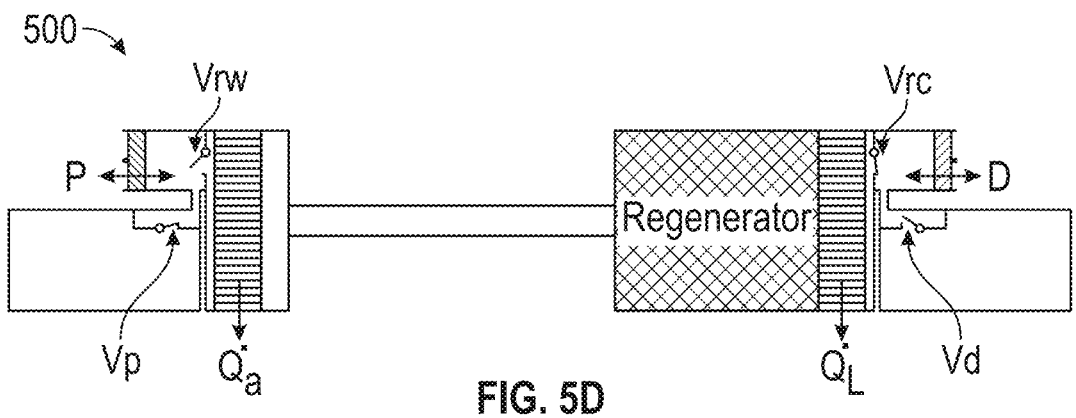
FIG. 5D illustrates a table of actuator states to perform a refrigeration cycle (e.g., a Stirling cycle) for a MEMS cryocooler including a compressor cell buffer volume and an expander cell buffer volume in accordance with an embodiment of the disclosure.

In some embodiments, compressor cell 512 and expander cell 542 may be arranged and/or controlled (e.g., by controller 592) to provide a digital mechanical machine or MEMS device, where transitions between operating states of MEMS compressor 417, MEMS displacer 447, and valves 524, 525, 554, and 555, are actuated relatively quickly and only to extremes, such as fully open (1) or closed (0) (e.g., for valves 524, 525, 554, and 555) or to minimum (1) and maximum (0) compression and expansion states (e.g., for MEMS compressor 417 and MEMS displacer 447). For example, FIG. 5D illustrates a table 504 of actuator states to perform a refrigeration cycle (e.g., a full Stirling cycle) for MEMS cryocooler 500 including compressor cell buffer volume 526 and expander cell buffer volume 556 in accordance with an embodiment of the disclosure. In various embodiments, controller 592 may be configured to implement the refrigeration cycle of table 504, as shown, to thereby operate MEMS cryocooler 500 as a digital mechanical machine, as described herein.

As shown in FIG. 5D and from table 504 and the legend diagram of MEMS cryocooler 500 below table 504, MEMS compressor 417 is labeled as column P, compressor cell buffer volume 526 is labeled as column Vp, compressor valve 524 is labeled as column Vrw, MEMS displacer 447 is labeled as column D, expander buffer volume valve is labeled as column Vd, and expander valve 554 is labeled as column Vrc. Actuation of the various devices is indicated by (1) (fully open or minimum compression/expansion) or (0) (fully closed or maximum compression/expansion). As can be seen from table 504, the compressor buffer volume assembly of compressor cell 512 is actuated to compress the working gas of MEMS cryocooler 500 through two compression sub-cycles (step a→b, referencing steps a through d of FIG. 1B), the compressor and expander buffer volume assemblies of compressor cell 512 and expander cell 542 are actuated through two displacement sub-cycles to displace working gas towards expander cell 542 (step b→c), the expander buffer volume assembly of expander cell 542 is actuated through two expansion sub-cycles to expand working gas towards expander cell 542 (step c→d), and the compressor and expander buffer volume assemblies of compressor cell 512 and expander cell 542 are actuated through a displacer sub-cycle to displace working gas towards compressor cell 512 (step d→a).

Other refrigeration cycles are contemplated, with different numbers and/or ordering or arrangement of sub-cycles from that shown in table 504. Moreover, while refrigeration cycle 504 may be repeated to continue cooling an electronic device at a set approximate cooling power, subsequent cycles may alternatively be modified to increase or decrease overall cooling power (e.g., to increase or decrease input power needs), as desired. In some embodiments, control transitions between rows of a digital refrigeration cycle (e.g., between rows of table 504) may occur at a substantially constant rate or frequency. In other embodiments, certain sub-cycles or individual control transitions within a digital refrigeration cycle may be performed at different selected frequencies, for example, to adjust a time evolution of individual control transitions, sub-cycles, and/or the digital refrigeration cycle as a whole. Such modifications may be performed in a feedback loop, for example, such as through use of a temperature sensor (e.g., electronic device 490) providing temperature feedback to controller 592.

Figure 6:
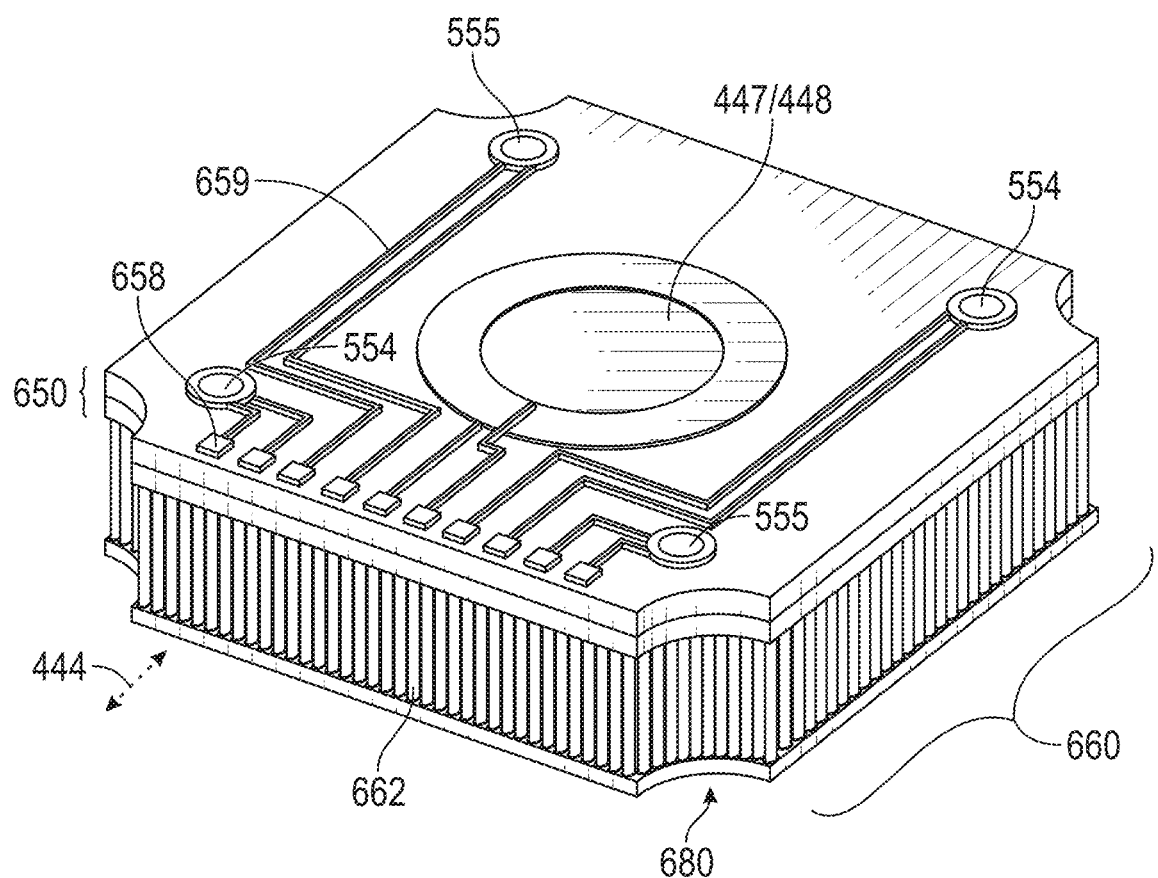
FIG. 6 illustrates an expander cell for a MEMS cryocooler in accordance with an embodiment of the disclosure.

FIG. 6 illustrates an expander cell 542 for MEMS cryocooler 500 in accordance with an embodiment of the disclosure. In the embodiment shown in FIG. 6, expander cell 542 is a four-layer MEMS structure (e.g., fabricated using four material layers) implemented with an expander buffer volume assembly, PZT actuators (e.g., expander actuator 448 of MEMS displacer 447, and actuators of MEMS expander valves 554 and MEMS buffer volume valves 555), cell heat exchanger 650 (e.g., a portion of cold heat exchanger 450), and cell regenerator 660 (e.g., a portion of shared regenerator 460) with regenerator matrix elements 662 configured to operate according to general bi-directional gas flow 444.

For example, the first base layer may be a silicon layer forming cell regenerator 660 (e.g., including a substrate layer configured to help seal regenerator 660). The second layer may be a metallic layer forming cell heat exchanger 650 (e.g., and various other expander cell structures). The third layer may be a membrane layer, such as a flexible material layer used to form a diaphragm for MEMS displacer 447. The fourth layer may be an actuator layer and include structure and materials capable of forming actuator 448 and/or actuators for valves 554 and 555, along with any associated circuitry 659 (e.g., traces and/or other circuitry), interfaces 658 (e.g., solder pads, wire bond pads, and/or other interfaces), and backside support for the membrane layer. In some embodiments, expander cell 542 may include cutouts 680 to facilitate securing expander cells to each other and/or a MEMS expander assembly to a working surface, for example.

Expander cell 542 may be formed individually and assembled into a MEMS expander assembly, for example, or may be formed alongside other similar expander cells to form a MEMS expander assembly, with may include an arrangement of expander cells selected for a particular cooling application, as described more fully herein. In general, each expander cell 542 may typically be formed with a length*width top view surface area of approximately 1 square millimeter and a height of between 0.2 and 1 millimeters (e.g., largely occupied by cell regenerator 650, as shown). A MEMS expander assembly implemented by a set of expander cells similar to expander cell 542 may be configured to provide a variety of different cooling powers across a range of temperatures, so as to cool a device dissipating up to approximately 170-200 mW to temperatures between approximately 200K and 60K, for example, or to temperatures between approximately 160K and 110K. In some embodiments, such expander assemblies, when coupled to an appropriate compressor assembly, may be configured and/or arranged to provide approximately 1 W of cooling power (e.g., across an approximate square inch of cold interface 441) at approximately 77K, and may in various embodiments be configured and/or arranged to provide approximately 5 W of cooling power at approximately 77K.

Figure 7A:
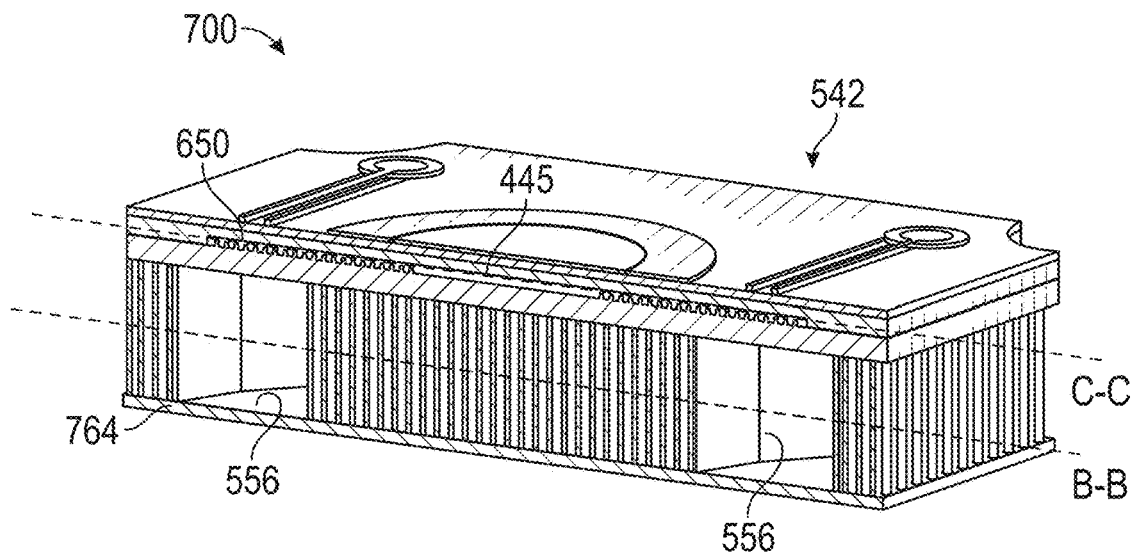
FIGS. 7A-C illustrate cut-away views of an expander cell for a MEMS cryocooler in accordance with an embodiment of the disclosure.
Figure 7B:
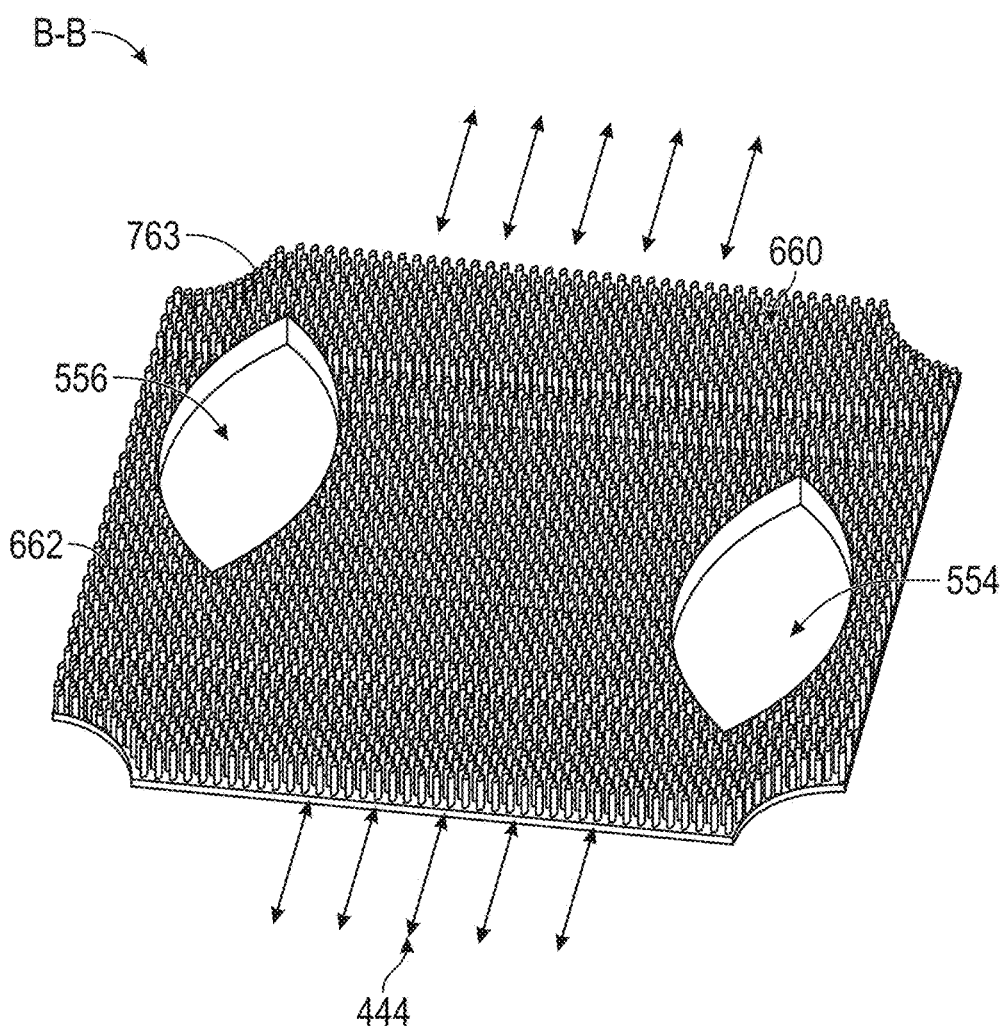
Figure 7C:
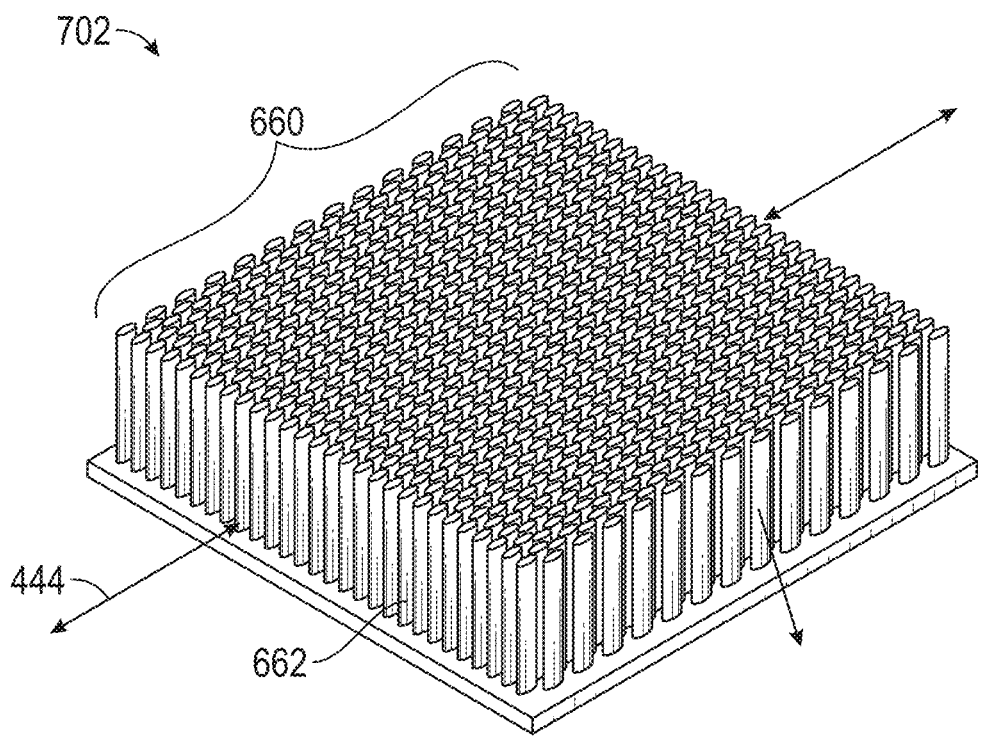

FIGS. 7A-C illustrate cut-away views of expander cell 542 for MEMS cryocooler 500 in accordance with an embodiment of the disclosure. For example, FIG. 7A is a cross section view 700 through a center of expander cell 542, which shows expansion buffer volumes 556, expansion volume 445, and a top surface/cavity of cell heat exchanger 650. As shown in FIG. 7A, expansion buffer volumes 556 may be disposed within and/or integrated into cell regenerator 660 (e.g., and/or shared regenerator 440), between cell heat exchanger 650 and expander cell base 764, in order to reduce the total number of necessary MEMS layers.

FIG. 7B is a top-down cross section view through line B-B in FIG. 7A, which shows a top surface 763 of expander cell base 764 (e.g., which may be formed integrally with regenerator matrix elements 662 of cell regenerator 660) and profiles and relative positions of expansion buffer volumes/chambers 556 relative to gas flow 444. As shown in FIG. 7B, expander cell 542 may include multiple expander cell buffer volumes 556, which may be disposed within different halves (e.g., near opposite sides) of expander cell 542 and substantially within cell regenerator 660, and may be staggered with respect to their relative positions along a direction of gas flow 444 within expander cell 542, as shown.

In some embodiments, the cross sectional profile of an expansion buffer volume/chamber 556 may be elongate in a direction along gas flow 444 within expander cell 542, for example, with relatively smooth lateral sides (e.g., single continuous curvilinear surfaces) tapering to narrow joins at leading/trailing ends of expansion buffer volume/chamber 556, roughly similar to the elongate profile of an American football. In related embodiments, the length of an elongate expansion buffer volume/chamber 556 along the direction of gas flow 444 may be approximately twice its width. Such cross sectional profiles (e.g., as viewed perpendicular to the plane of expander cell base 764) generally extend vertically from expander cell base 764 to, for example, cell heat exchanger 650 due to the typical limitations of common MEMS fabrication techniques.

FIG. 7C is a close up view 702 of a portion of cell regenerator 660 and regenerator matrix elements 662, which shows a general profile of the individual regenerator matrix elements 662 relative to gas flow 444 and the generally planar layout of expander cell 542. In various embodiments, each regenerator matrix element 662 may be implemented as a pillar disposed orthogonal to and between cell heat exchanger 650 and expander cell base 764. Moreover, the cross sectional profile for the individual regenerator matrix elements 662 (e.g., as viewed perpendicular from expander cell base 764) may be generally similar to the cross sectional profile of the expansion buffer volumes/chambers 556, with respect to the direction of gas flow 444 within expander cell 542, but smaller. As such, the cross sectional profiles for regenerator matrix elements 662 may be an elongate cross sectional profile aligned with a direction of gas flow through expander cell 542.

Figure 7D:
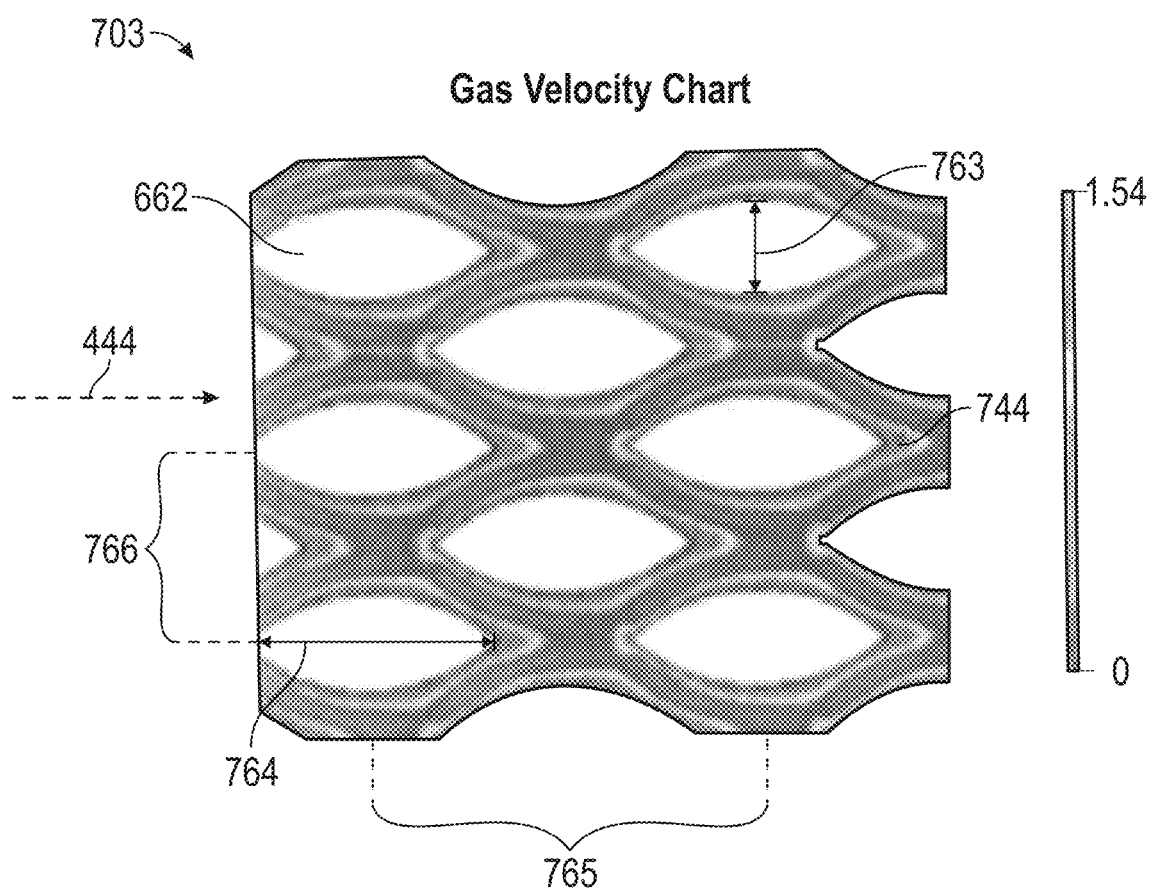
FIG. 7D illustrates a gas velocity chart for a regenerator of an expander cell for a MEMS cryocooler in accordance with an embodiment of the disclosure.

For example, FIG. 7D illustrates a gas velocity chart 703 for an arrangement of regenerator matrix elements 662 of expander cell 542 for MEMS cryocooler 500 in accordance with an embodiment of the disclosure. Each cross sectional profile of regenerator matrix elements 662 shown in graph 703 has a length 764 roughly equal to twice its width 763. As can be seen from the laminar velocity field reproduced in graph 703, the elongate cross sectional profile of regenerator matrix element 662 and its orientation relative to gas flow 444 produces no discernible flow separation (e.g., as illustrated by trailing edge flows 744, which show no separation of the laminar flow from the surface of one element or jumping to an adjacent element along the direction of flow) and very little pressure drop, which helps to increase the efficiency of shared regenerator 460 and/or MEMS cryocooler 500.

In general, the width 763, length 764, longitudinal spacing 765, and lateral spacing of regenerator matrix elements 662 may be adjusted to restrict or ease flow, for example, so as to provide a known flow of a working gas with a temperature dependent viscosity. Regenerator matrix elements 662 may be formed from silicon, doped silicon, and/or a metalized/coated material, for example, to facilitate operation as part of shared regenerator 460.

Figure 8A:
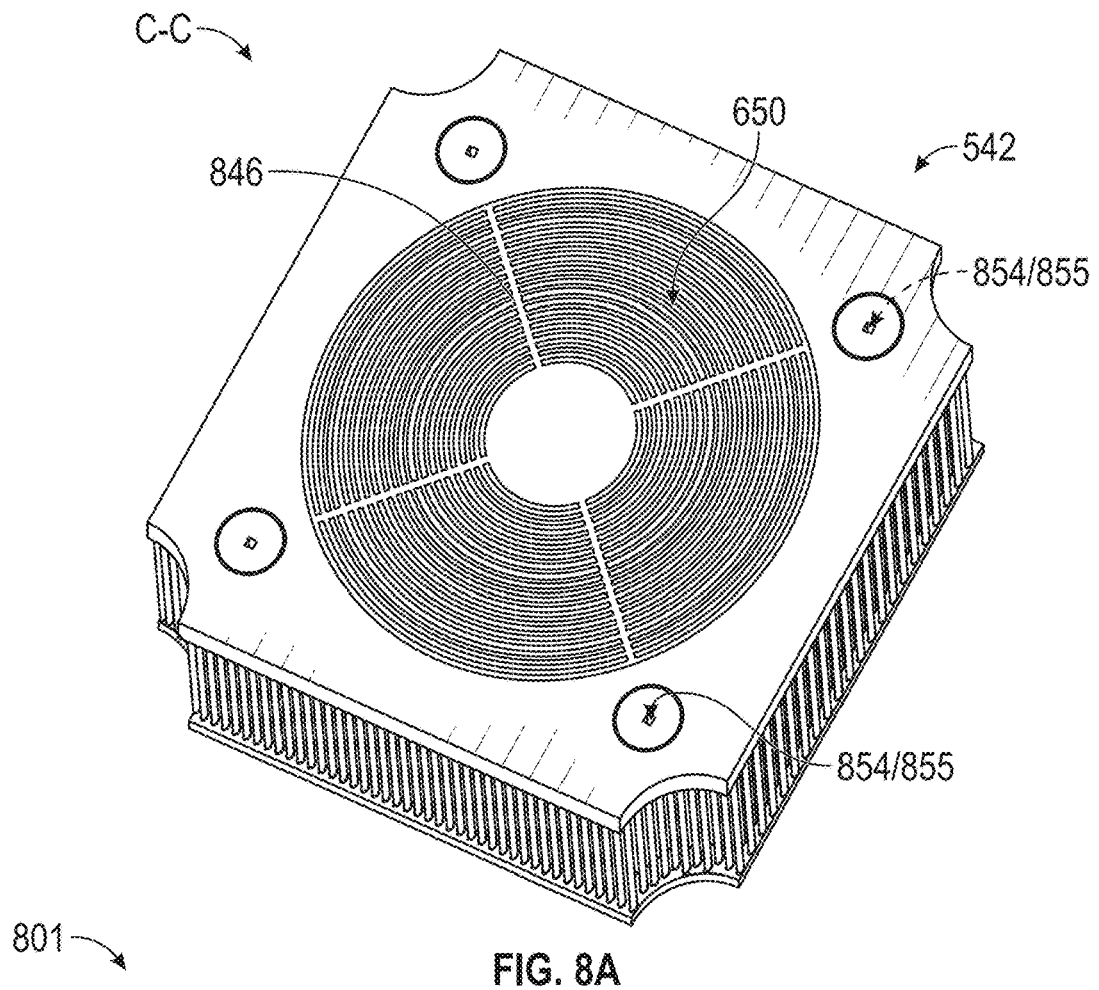
FIG. 8A illustrates a cut-away view of an expander cell for a MEMS cryocooler in accordance with an embodiment of the disclosure.

FIG. 8A illustrates a cut-away view of expander cell 542 for MEMS cryocooler 500 in accordance with an embodiment of the disclosure. More specifically, FIG. 8A is a top-down cross section view through line C-C in FIG. 7A, which shows a top surface of cell heat exchanger 650, gas channels 846 within cell heat exchanger 650 and between expansion volume 445 and expander valves/expander buffer volume valves 854/855 (or their valve seats), all of which may be formed from a single MEMS layer.

Figure 8B:
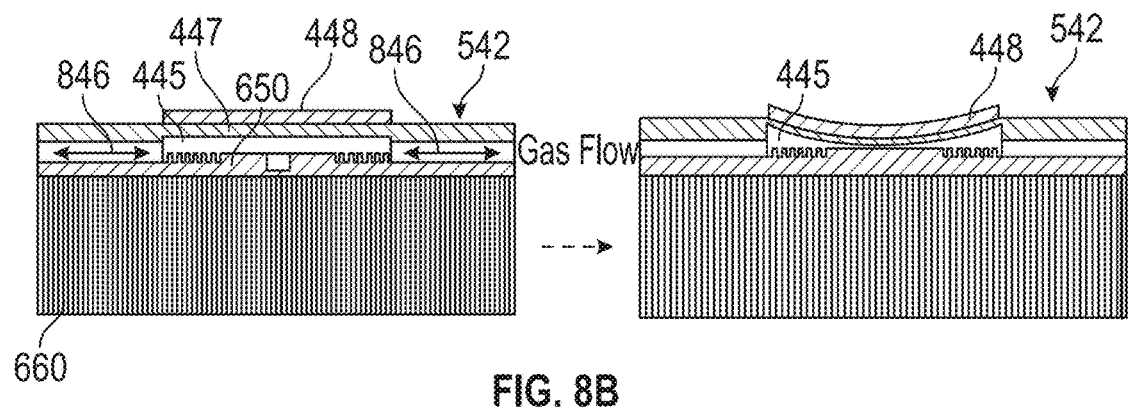
FIG. 8B illustrates operation of a MEMS displacer for an expander cell of a MEMS cryocooler in accordance with an embodiment of the disclosure.

FIG. 8B illustrates operation of MEMS displacer 447 for expander cell 542 of MEMS cryocooler 500 in accordance with an embodiment of the disclosure. On the left side of state diagram 801, MEMS actuator 448 of MEMS displacer 447 is de-energized to create a maximum volume for expansion volume 445, generally drawing working gas from cell regenerator 660, shared regenerator 460, and/or expander cell buffer volume 556 (e.g., depending on the current valve settings) through gas channels 846 and across cell heat exchanger 650 into expansion volume 445. On the right side of state diagram 801, MEMS actuator 448 is energized to create a minimum volume for expansion volume 445, generally expelling working gas from expansion volume 445 across cell heat exchanger 650 through gas channels 846 and into cell regenerator 660, shared regenerator 460, and/or expander cell buffer volume 556.

Figure 9:
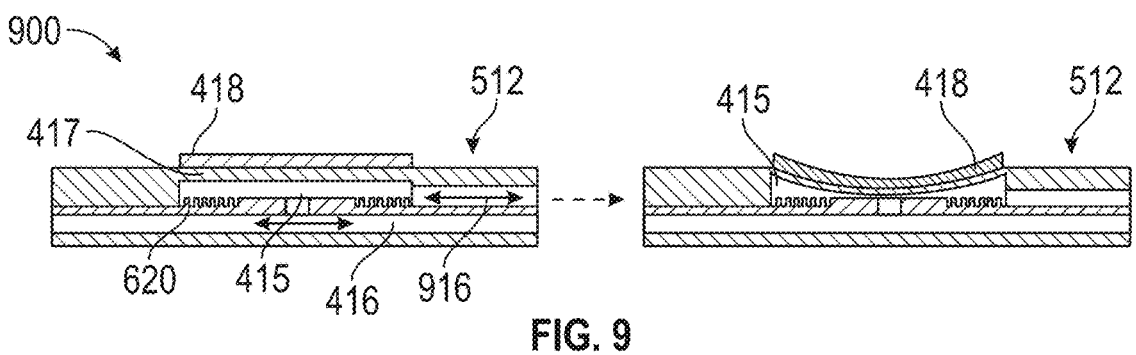
FIG. 9 illustrates operation of a MEMS compressor for a compressor cell of a MEMS cryocooler in accordance with an embodiment of the disclosure.

FIG. 9 illustrates operation of MEMS compressor 417 for compressor cell 512 of MEMS cryocooler 500 in accordance with an embodiment of the disclosure. On the left side of state diagram 900, MEMS actuator 418 of MEMS compressor 417 is de-energized to create a maximum volume for compression volume 415, generally drawing working gas from shared gas channel 416 and/or compressor cell buffer volume 526 (e.g., depending on the current valve settings) through gas channels 916 and across cell heat exchanger 620 into compression volume 415. On the right side of state diagram 900, MEMS actuator 418 is energized to create a minimum volume for compression volume 415, generally expelling working gas from compression volume 415 across cell heat exchanger 620 through gas channels 916 and into shared gas channel 416 and/or compressor cell buffer volume 526.

Figure 10A:
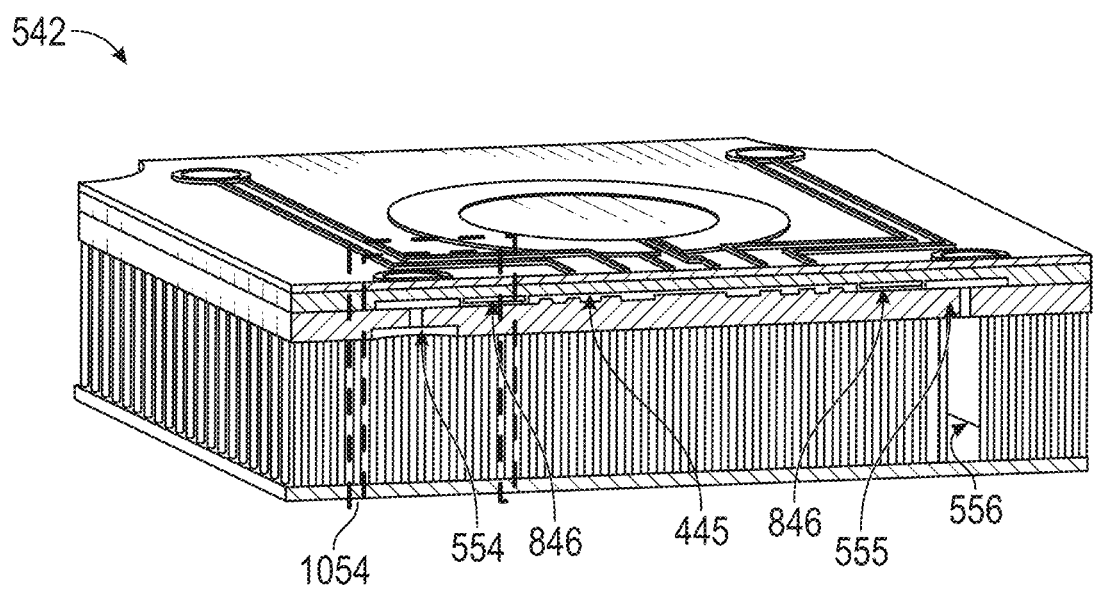
FIGS. 10A-B illustrate operation of a MEMS valve for an expander cell of a MEMS cryocooler in accordance with an embodiment of the disclosure.
Figure 10B:
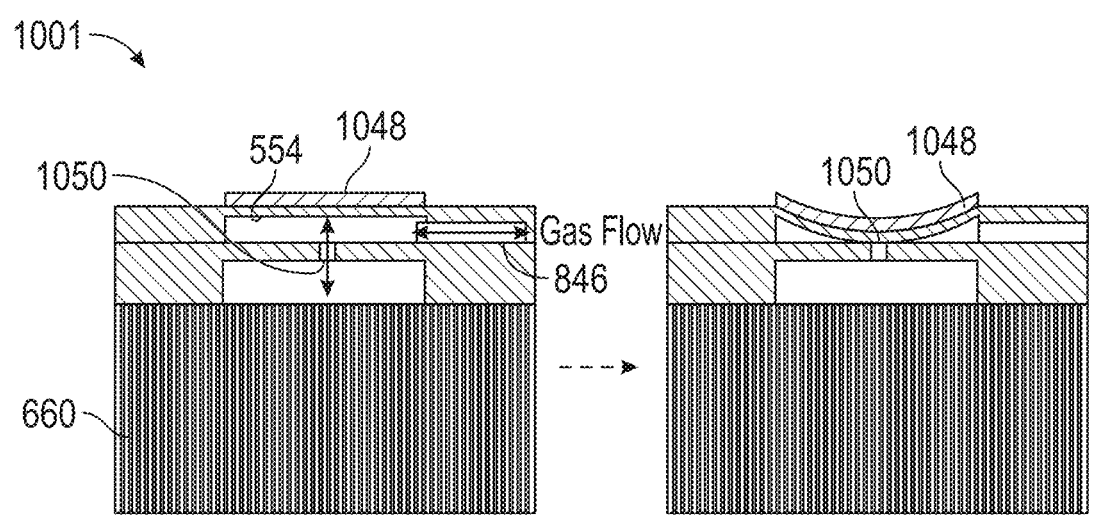

FIGS. 10A-B illustrate operation of a MEMS valve for an expander cell of a MEMS cryocooler in accordance with an embodiment of the disclosure. In particular, FIG. 10A shows a cross section of expander cell 542 through expander valve 554 and expander buffer volume valve 555, which shows expansion volume 445 and gas channels 846 between expansion volume 445 and expander valve 554 and expander buffer volume valve 555. Inset 1054 is reproduced in state diagram 1001.

FIG. 10B illustrates operation of MEMS expander valve 554 for expander cell 542 of MEMS cryocooler 500 in accordance with an embodiment of the disclosure. On the left side of state diagram 1001, MEMS actuator 1048 of MEMS expander valve 554 is de-energized to allow free flow of working gas through gas channel 846 and valve port 1050 and between expansion volume 445 and cell regenerator 660 and/or shared regenerator 460. On the right side of state diagram 1001, MEMS actuator 1048 is energized to cause MEMS expander valve 554 to stop against and block valve port 1050, thereby blocking flow of working gas through gas channel 846 and valve port 1050 and between expansion volume 445 and cell regenerator 660 and/or shared regenerator 460. Similar valve structures and operations may be used to implement any of compressor valve 524 and buffer volume valves 525, 555. In some embodiments, two or more such valve structures may be arranged (e.g., in parallel) and used to control gas flows with relatively high pressure differentials across the valves.

Figure 11:
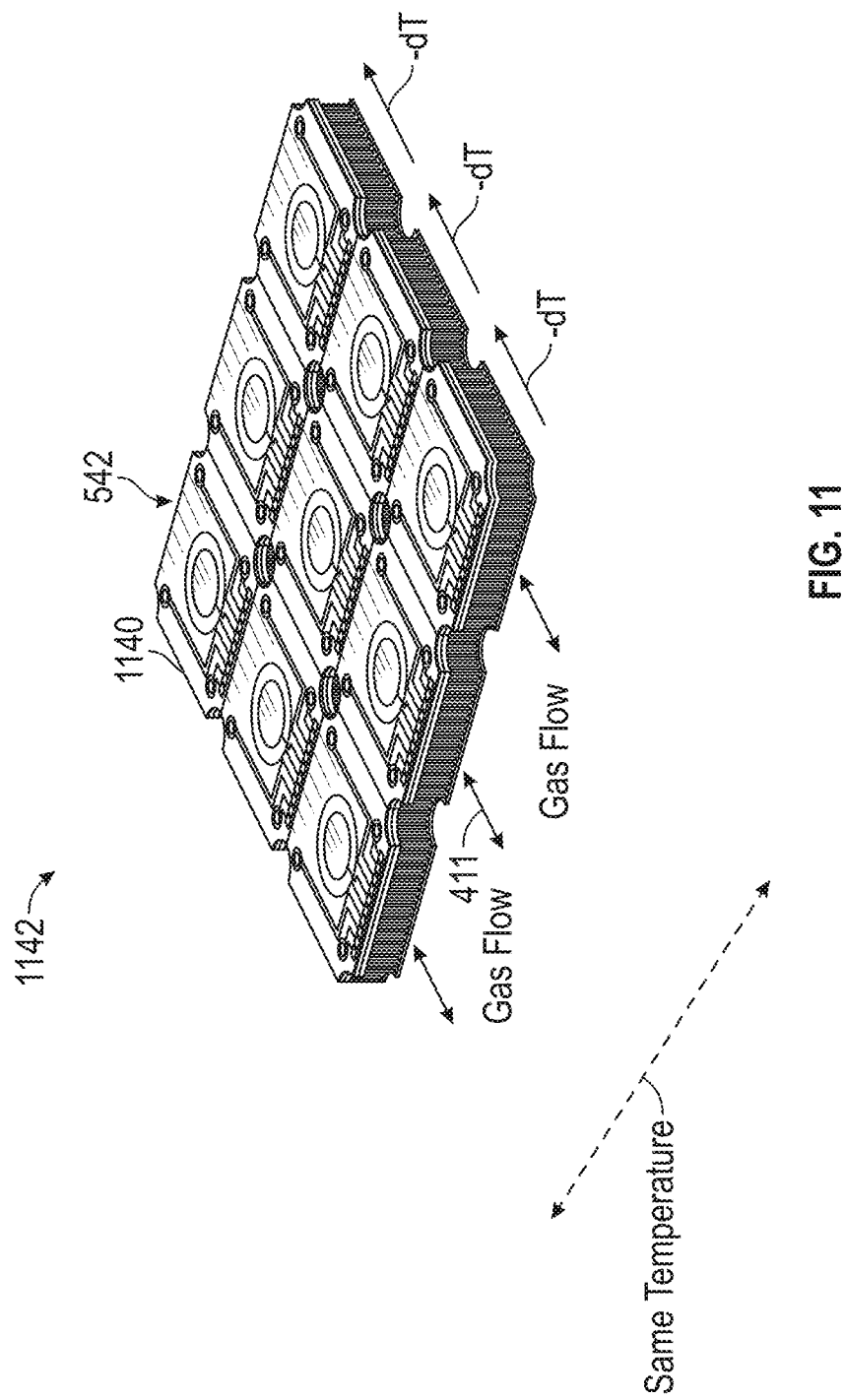
FIG. 11 illustrates a block diagram of an expander cell arrangement for a MEMS expander assembly of a MEMS cryocooler in accordance with an embodiment of the disclosure.

As noted herein, embodiments of the present disclosure include MEMS expansion assemblies implemented by expander cells that may be grouped and/or arranged for increasing cooling power and/or for achieving relatively low cooling temperatures, including cryogenic temperatures. FIG. 11 illustrates a block diagram of an expander cell arrangement 1142 for a MEMS expander assembly 1140 of MEMS cryocooler 500 in accordance with an embodiment of the disclosure. As shown in FIG. 11, symmetric expander cell arrangement 1142 includes three rows of expander cells 542 arranged parallel to gas flow 411, which results in the expander cells within each parallel row to operate at approximately the same cooling power and/or temperature (e.g., with respect to a commonly coupled heat load). In addition, expander cell arrangement 1142 includes three rows of expander cells 542 arranged serially along the direction of gas flow 411, which results in the expander cells within each serial row to operate at increasing cooling power and decreasing temperature.

With this knowledge of the general trend, an expander cell arrangement within a particular MEMS expander assembly may include a selected plurality of expander cells 542 coupled to each other in parallel (relative to the direction of gas flow) to generate a specified cooling power (e.g., at a given temperature) while additional expander cells 542 may be coupled serially (relative to the direction of gas flow) to generate a desired temperature gradient. Such expander cell arrangements may be used to provide a particular cooling power at particular temperatures and/or spatial positions, for example, to provide a particular temperature gradient over a particular spatial area, and/or to facilitate reaching the highest cooling power/lowest temperature for a given heat load within a particular overall design volume for MEMS cryocooler 500.

Figure 12:
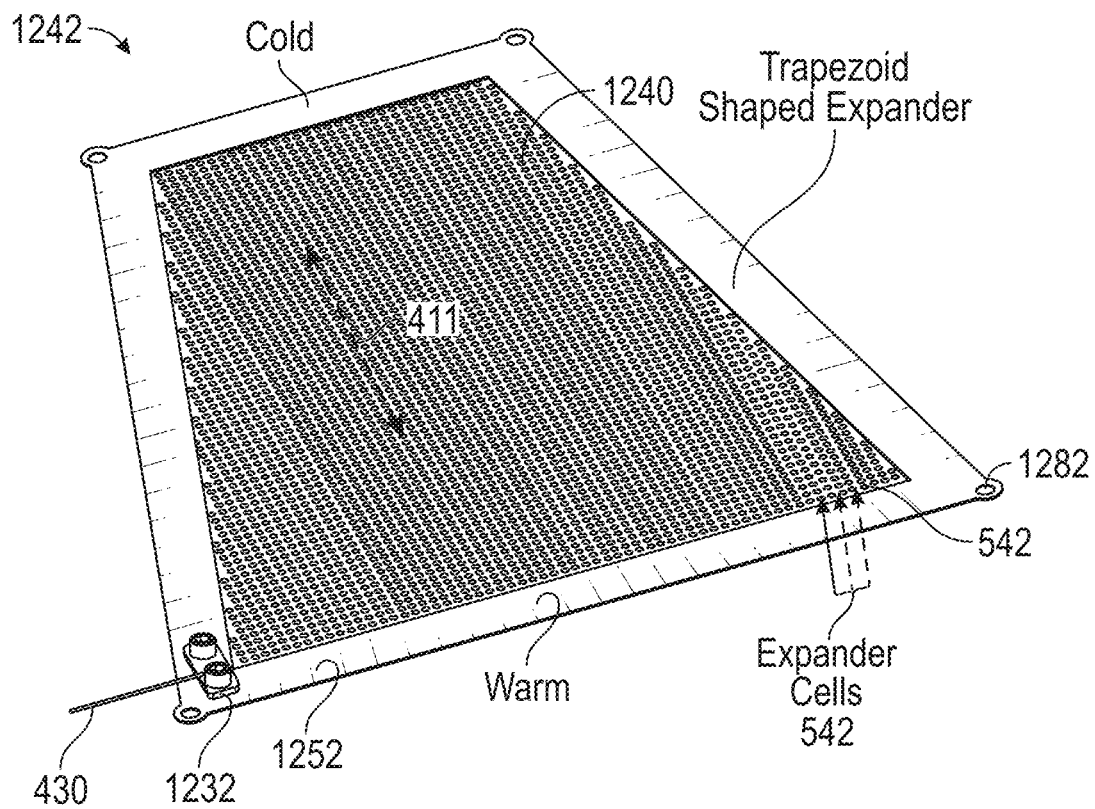
FIG. 12 illustrates an expander cell arrangement for a MEMS cryocooler in accordance with an embodiment of the disclosure.

Various expander cell arrangements within an expander cell assembly are possible. For example, FIG. 12 illustrates a trapezoid expander cell arrangement 1242 of MEMS expander assembly 1240 for MEMS cryocooler 500 in accordance with an embodiment of the disclosure. As shown in FIG. 12, MEMS expander assembly 1240 is coupled to a compressor assembly through gas transfer line 430, which allows gas to flow among expander cells 542 generally along gas flow direction 411 between the relatively warm and cold ends of MEMS expander assembly 1240. Gas transfer tube 430 may be secured to MEMS expander assembly housing 1252 by interface/clamp 1232, and MEMS expander assembly housing 1252 may include one or more securing features (e.g., screw holes, and/or other securing features) 1282 configured to help secure MEMS expander assembly 1240 to a support structure and/or an electronic device to be cooled. As shown in FIG. 12, expander cell arrangement 1242 of MEMS expander assembly 1240 can be trapezoid shaped, such that more expander cells 542 per row are used at higher temperatures and lower working gas densities, and fewer expander cells 542 (or smaller expander cells 542) are used at lower temperatures at which the density of the working gas is higher (e.g., and less volume needs to be displaced in order to reach a desired cooling power/partial cooling power at a particular expander cell 542).

Figure 13:
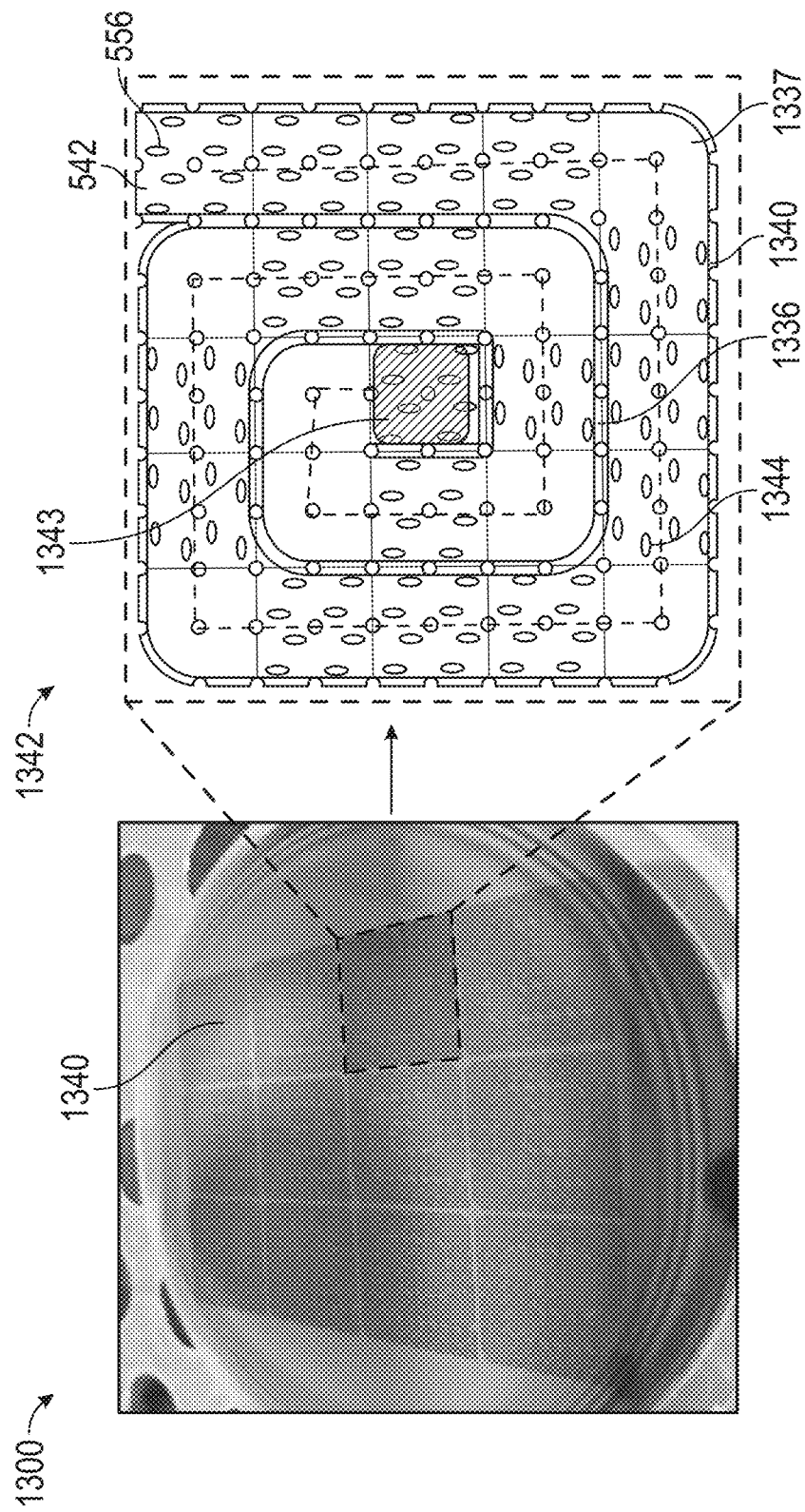
FIG. 13 illustrates an expander cell arrangement for a MEMS cryocooler in accordance with an embodiment of the disclosure.

FIG. 13 illustrates a spiral expander cell arrangement 1342 of MEMS expander assembly 1340 for MEMS cryocooler 500 in accordance with an embodiment of the disclosure. As shown in FIG. 12, MEMS expander assembly 1340 includes pairs of expander cells 542, each with expander cell buffer volumes 556, arranged in a spiral arrangement corresponding to gas flow 1344 and ending at a cold end 1343. Inner spirals are thermally decoupled/insulated from outer spirals by spiral insulator 1336, which in some embodiments may be implemented with a vacuum space or a thermally insulating material. In some embodiments, MEMS expander assembly 1340 may include one or more gas flow decouplers 1337 configured to thermally decouple otherwise contiguous expander cell sub-arrangements to thermally decouple or insulate such expander cell sub-arrangements from each other, for example, and/or to redirect gas flow 1344, as shown.

Also as shown in diagram 1300, multiple such MEMS expander assemblies 1340 (e.g., twelve or more) may be formed at once using MEMS fabrication techniques, including etching from silicon. In some embodiments, spiral MEMS expander assemblies 1340 may be secondary MEMS expander assemblies coupled to ends of a primary MEMS expander assembly (e.g., symmetric MEMS expander assembly 1140, trapezoidal MEMS expander assembly 1240, and/or other MEMS expander assemblies) to provide a localized spiral patterned cooling surface, for example, with increased cooling efficiency and/or power. In general, a spiral MEMS expander assembly can help to improve the form factor of a MEMS cooler-dewar design for miniaturizing cooled, sensor systems, such as thermal cameras. For example, cold end 1343 and a thermal interface to an FPA of an infrared camera may be located at the center of the spiral MEMS expander assembly, and the leads to the FPA may be distributed along the gradually increasing temperatures along the spiral.

Figure 14:
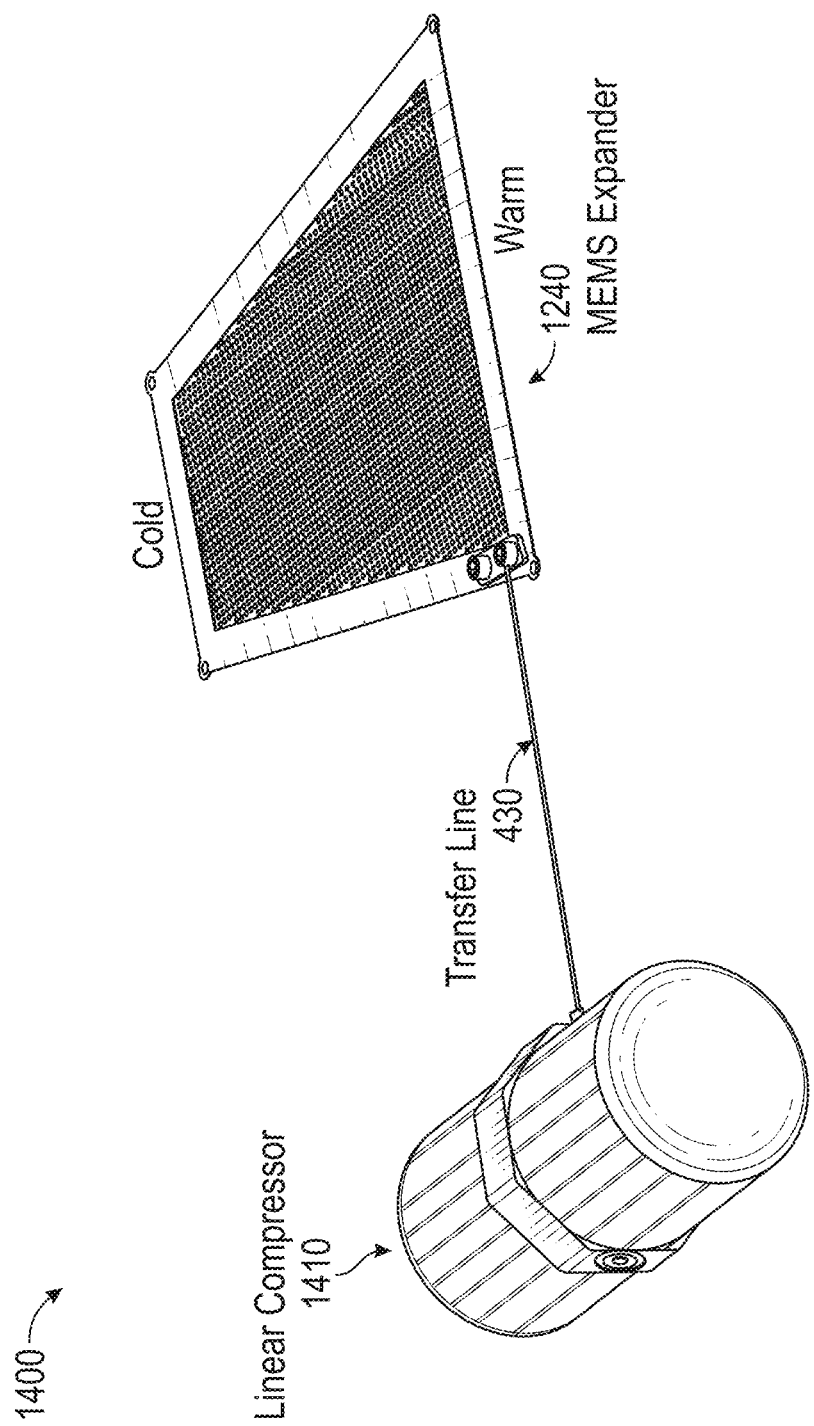
FIG. 14 illustrates a MEMS cryocooler in accordance with an embodiment of the disclosure.
Figure 15:
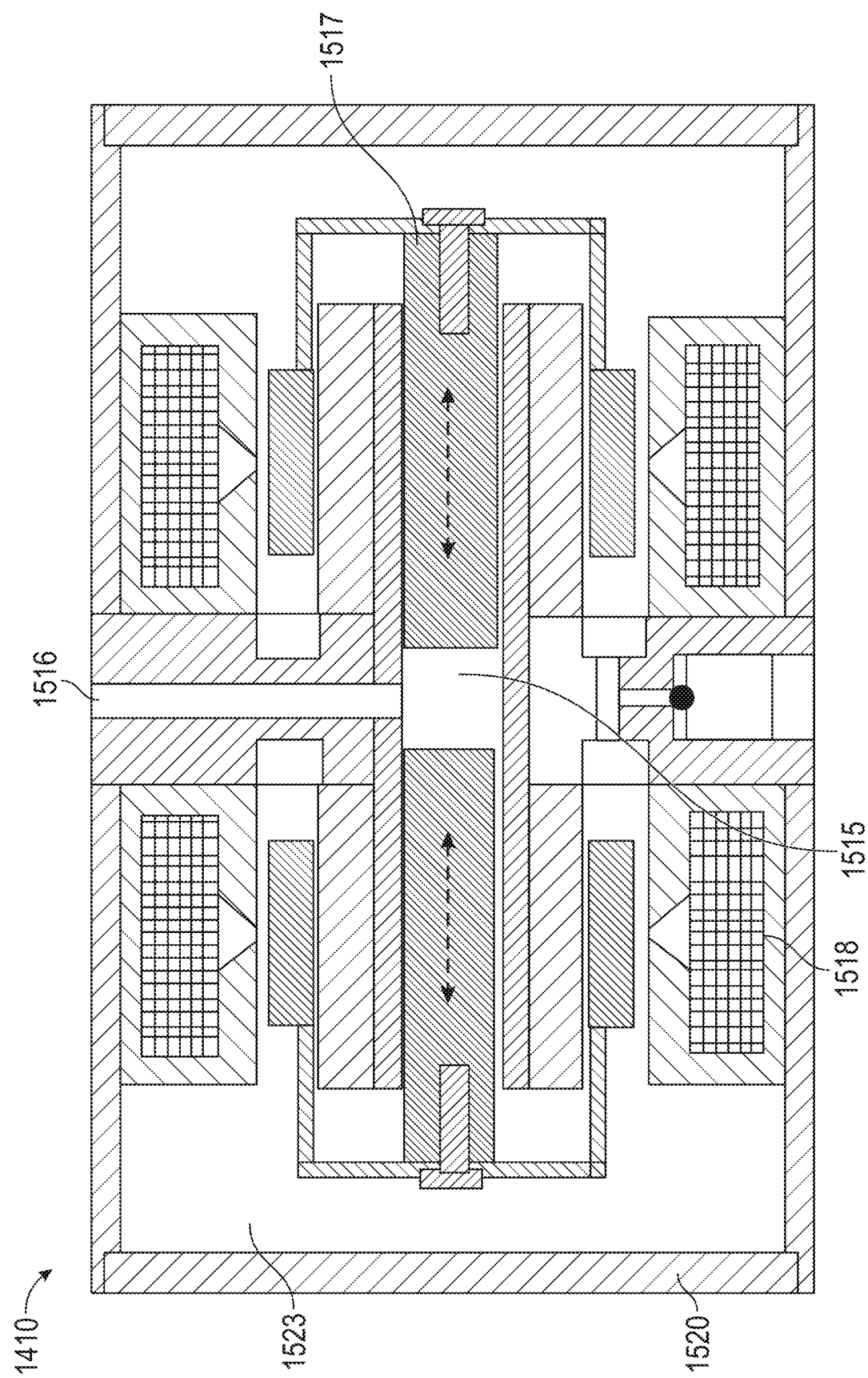
FIG. 15 illustrates a linear compressor for a MEMS cryocooler in accordance with an embodiment of the disclosure.

As noted above, it is possible to pair a MEMS expander assembly with conventional compressor assembly rather than a MEMS compressor assembly, yet still achieve many of the benefits described herein. FIG. 14 illustrates a MEMS cryocooler 1400 including a linear compressor 1410 in accordance with an embodiment of the disclosure. For example, in some embodiments, controller 592 of FIG. 5A may be configured to control operation of linear compressor 1410 and MEMS expander assembly 1240 to provide an operating MEMS cryocooler 1400 with MEMS expander assembly 1240 spaced and thermally decoupled from linear compressor 1410 by gas transfer line 1400, as shown. FIG. 15 is a block diagram of linear compressor 1410 for MEMS cryocooler 1400 in accordance with an embodiment of the disclosure. As shown in FIG. 15, linear compressor 1410 includes compression volume 1515 compressed by reciprocating pistons 1517 to generate mass flow and/or pressure waves in a working gas through gas channel 1516 (e.g., which is coupled to gas transfer line 430). Reciprocating pistons 1517 may be actuated by linear motors/motor components 1518. All such components may be sealed together within compressor housing 1520, which may include bounce space 1523 to allow for motion of reciprocating pistons 1517 and various motor components 1518.

Figure 16:
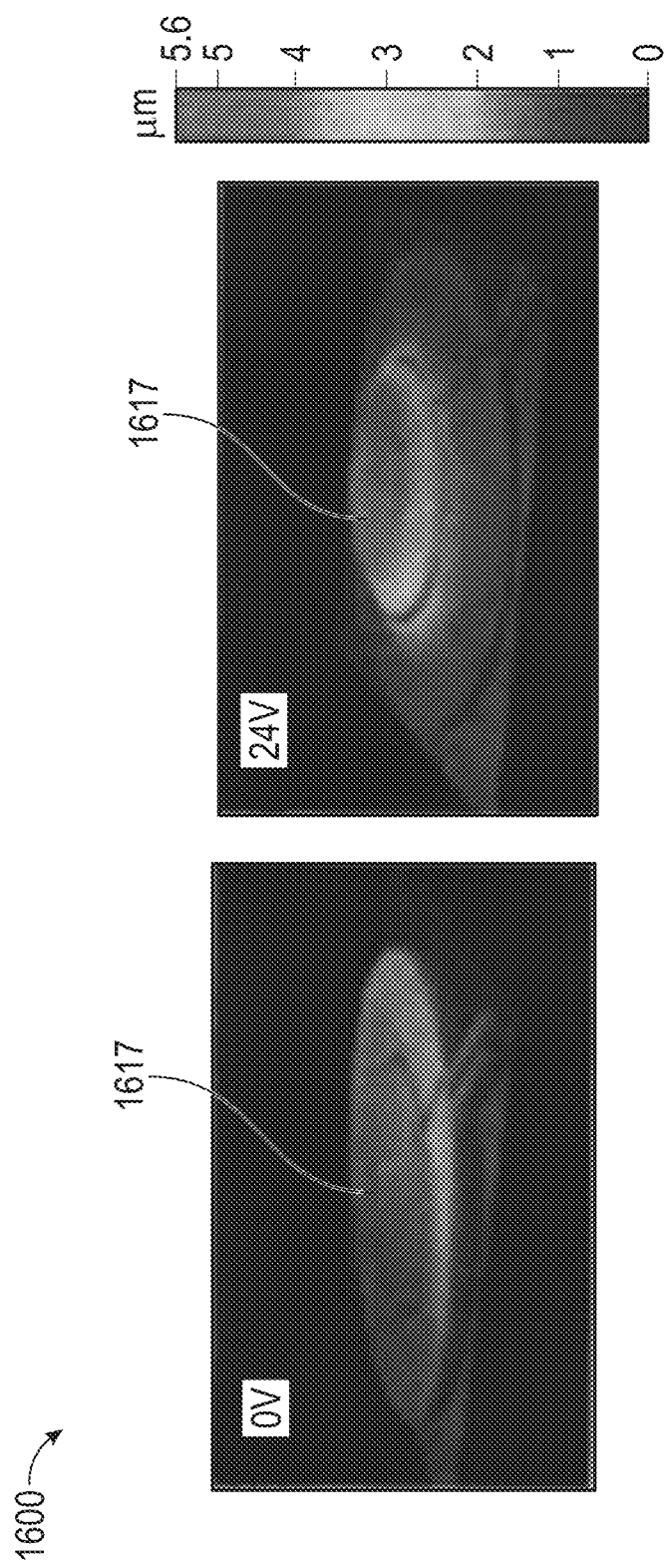
FIG. 16 illustrates operation of a MEMS actuator for a MEMS cryocooler in accordance with an embodiment of the disclosure.

FIG. 16 illustrates operation of MEMS actuator 1617 for a MEMS cryocooler in accordance with an embodiment of the disclosure. On the left side of state diagram 1600, actuator 1617 is de-energized, which results in a corresponding MEMS displacer, compressor, or valve conforming generally to the at-rest shape of a constituent diaphragm or membrane layer, for example. One the right side of state diagram 1600, actuator 1617 is energized, thereby deforming the constituent diaphragm approximately 5um at its center in response to an applied voltage of 24 volts, as shown. Such actuated deformation may be used to implement any of the MEMS actuated valves, expanders, compressors, and/or other components described herein.

Figure 17:
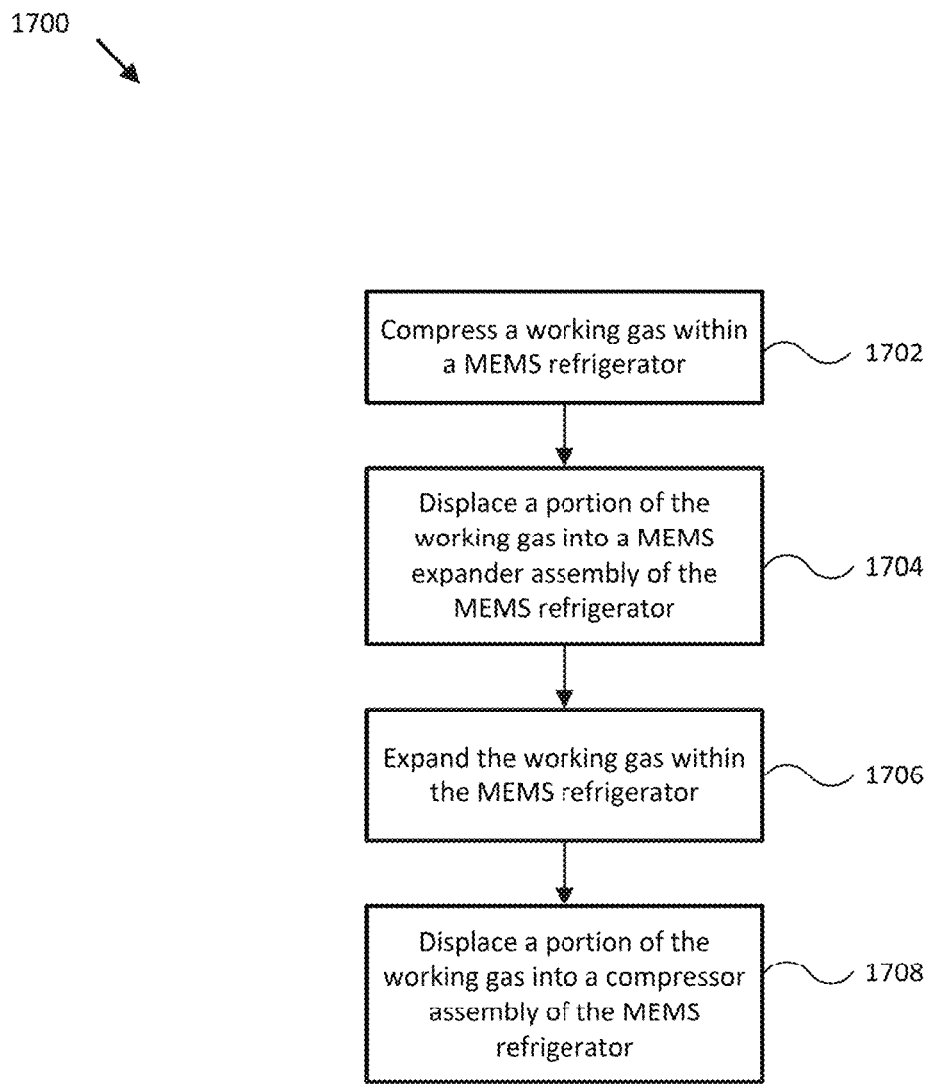
FIG. 17 is a flowchart illustrating a method for operating a MEMS cryocooler in accordance with an embodiment of the disclosure.

FIG. 17 is a flowchart illustrating a method for operating a MEMS cryocooler in accordance with an embodiment of the disclosure. One or more portions of process 1700 may be performed by controller 592 and utilizing any elements of MEMS refrigerators/cryocoolers described with reference to FIGS. 1A-16. It should be appreciated that any step, sub-step, sub-process, or block of process 1700 may be performed in an order or arrangement different from the embodiment illustrated by FIG. 17. In some embodiments, any portion of process 1700 may be implemented in a loop so as to continuously operate, such as in a refrigeration cycle, for example.

At block 1702, a working gas is compressed within a MEMS refrigerator. For example, controller 592 may be configured to control linear compressor 1410 or MEMS compressor assembly 410 to compress a working gas within MEMS refrigerator 1400 and/or 400, similar to the transition from step a to step b in FIG. 1B. In embodiments incorporating a MEMS compressor assembly including expander cell buffer volumes, block 1702 may include one or multiple compression sub-cycles similar to those described and shown in table 504 of FIG. 5D.

At block 1704, a portion of working gas is displaced into a MEMS expander assembly of a MEMS refrigerator. For example, controller 592 may be configured to control linear compressor 1410 or MEMS compressor assembly 410 and MEMS expander assembly 1440 or 440 to displace a portion of the working gas within MEMS refrigerator 1400 and/or 400 into the corresponding MEMS expander assembly, similar to the transition from step b to step c in FIG. 1B. In embodiments incorporating a MEMS compressor assembly including expander cell buffer volumes, block 1704 may include one or multiple cold displacement sub-cycles similar to those described and shown in table 504 of FIG. 5D.

At block 1706, a working gas is expanded within a MEMS refrigerator. For example, controller 592 may be configured to control MEMS expander assembly 1440 or 440 to expand a working gas within MEMS refrigerator 1400 and/or 400, similar to the transition from step c to step d in FIG. 1B. In embodiments incorporating a MEMS compressor assembly including expander cell buffer volumes, block 1706 may include one or multiple expansion sub-cycles similar to those described and shown in table 504 of FIG. 5D.

At block 1708, a portion of working gas is displaced into a compressor assembly of a MEMS refrigerator. For example, controller 592 may be configured to control linear compressor 1410 or MEMS compressor assembly 410 and MEMS expander assembly 1440 or 440 to displace a portion of the working gas within MEMS refrigerator 1400 and/or 400 into the corresponding compressor assembly, to transfer heat from the MEMS expander assembly to the compressor assembly, similar to the transition from step d to step a in FIG. 1B. In embodiments incorporating a MEMS compressor assembly including expander cell buffer volumes, block 1706 may include one or multiple cold displacement sub-cycles similar to those described and shown in table 504 of FIG. 5D. Accordingly, a MEMS cryocooler/refrigerator advantageously including a MEMS expander assembly as described herein may be operated to cool a coupled electronic device.

Figure 18:
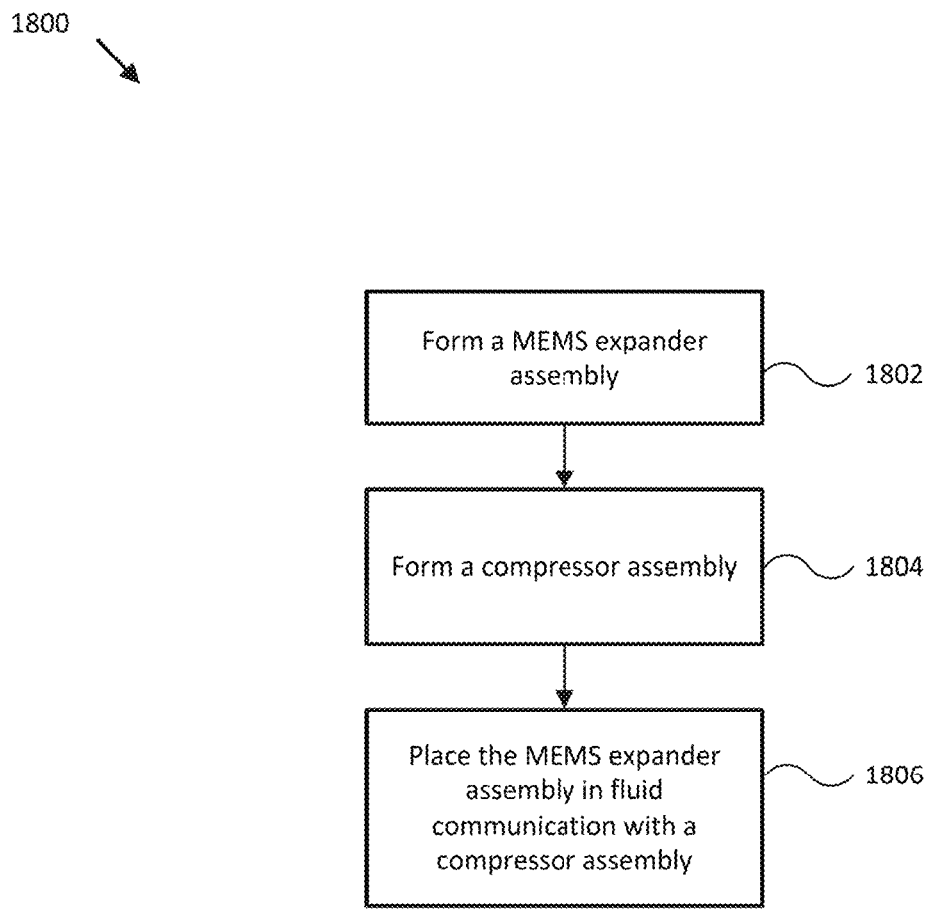
FIG. 18 is a flowchart illustrating a method for manufacturing a MEMS cryocooler in accordance with an embodiment of the disclosure.

FIG. 18 is a flowchart illustrating a method for manufacturing a MEMS cryocooler in accordance with an embodiment of the disclosure. One or more portions of process 1800 may be performed by a MEMS fabrication system (e.g., material growth, etching, patterning, and/or other MEMS fabrication subsystems) and/or other fabrication systems that can be configured to form any elements of MEMS refrigerators/cryocoolers and/or other electronic devices, sensor systems, and/or infrared cameras described with reference to FIGS. 1A-16. It should be appreciated that any step, sub-step, sub-process, or block of process 1800 may be performed in an order or arrangement different from the embodiment illustrated by FIG. 18. In some embodiments, any portion of process 1800 may be implemented in a loop so as to form multiple MEMS cryocoolers, such as in a manufacturing assembly line, for example.

At block 1802, a MEMS expander assembly is formed. For example, a MEMS fabrication system may be configured to form MEMS expander assembly 540, which includes a plurality of expander cells 542 each comprising MEMS displacer 447, cell regenerator 660, and expansion volume 445 disposed between MEMS displacer 447 and cell regenerator 660. As described herein, the corresponding plurality of cell regenerators may be configured to combine to form contiguous shared regenerator 460 for MEMS expander assembly 540.

In some embodiments, at least one of the plurality of expander cells 542 includes an expander buffer volume assembly, and the forming the MEMS expander assembly includes forming expander cell buffer volume 556 in regenerator cell 660, forming buffer volume valve 555 disposed between expander cell buffer volume 556 and expansion volume 445 of the at least one expander cell 542, and forming expander valve 554 disposed between expansion volume 445 and cell regenerator 660. Cell regenerator 660 may itself include a plurality of regenerator matrix elements 662, and each regenerator matrix element 662 may be characterized by an elongate cross sectional profile aligned with a direction of gas flow 444 through the at least one expander cell 542.

At block 1804, a compressor assembly is formed. For example, a manufacturing system may be configured to provide or form linear compressor 1410. In embodiments where the compressor assembly is a MEMS compressor assembly, a MEMS fabrication system may be configured to form MEMS compressor assembly 510, which includes a plurality of compressor cells 512 each comprising MEMS compressor 417, cell heat exchanger 420, and compression volume 415 disposed between MEMS compressor 417 and cell heat exchanger 420.

In some embodiments, at least one of the plurality of compressor cells 512 includes a compressor buffer volume assembly, and the forming the MEMS compressor assembly includes forming compressor cell buffer volume 526, forming buffer volume valve 525 disposed between compressor cell buffer volume 526 and compression volume 415 of the at least one compressor cell 512, and forming compressor valve 524 disposed between compression volume 415 and cell heat exchanger 420.

At block 1806, a MEMS expander assembly is placed in fluid communication with a compressor assembly. For example, an assembly system may be configured to couple MEMS expander assembly 540 to one end of gas transfer line 430 and to couple linear compressor 1410 or MEMS compressor assembly 410 to the other end of gas transfer line 430 in order to form MEMS refrigerator/cryocooler 1400 or 400. Accordingly, a MEMS refrigerator is formed that incorporates a MEMS expander assembly with an improved shared regenerator thermally decoupled from the compressor assembly in order to increase overall cooling power, as described herein.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A system comprising:
a compressor assembly; and
a microelectromechanical systems (MEMS) expander assembly in fluid communication with the compressor assembly via a gas transfer line configured to physically separate and thermally decouple the MEMS expander assembly from the compressor assembly, wherein:
the MEMS expander assembly comprises a plurality of expander cells each comprising a MEMS displacer, a cell regenerator, and an expansion volume disposed between the MEMS displacer and the cell regenerator, and
the plurality of cell regenerators are configured to combine to form a contiguous shared regenerator for the MEMS expander assembly.

2. The system of claim 1, wherein:
at least one of the plurality of expander cells comprises an expander buffer volume assembly; and
the expander buffer volume assembly comprises an expander cell buffer volume, a buffer volume valve disposed between the expander cell buffer volume and the expansion volume of the at least one expander cell, and an expander valve disposed between the expansion volume and the cell regenerator of the at least one expander cell.

3. The system of claim 2, wherein:
the expander cell buffer volume is disposed within the cell regenerator of the at least one expander cell; and
the expander cell buffer volume comprises an elongate cross sectional profile aligned with a direction of gas flow through the cell regenerator.

4. The system of claim 2, wherein:
the MEMS displacer, the expander valve, or the buffer volume valve comprises a MEMS actuator.

5. The system of claim 1, wherein:
the cell regenerator comprises a plurality of regenerator matrix elements; and
each regenerator matrix element comprises an elongate cross sectional profile aligned with a direction of gas flow through the at least one expander cell.

6. The system of claim 1, wherein:
the compressor assembly comprises a MEMS compressor assembly; and
the MEMS compressor assembly comprises a plurality of compressor cells each comprising a MEMS compressor, a cell heat exchanger, and a compression volume disposed between the MEMS compressor and the cell heat exchanger.

7. The system of claim 6, wherein:
at least one of the plurality of compressor cells comprises a compressor buffer volume assembly; and
the compressor buffer volume assembly comprises a compressor cell buffer volume, a buffer volume valve disposed between the compressor cell buffer volume and the compressor volume of the at least one compressor cell, and a compressor valve disposed between the compressor volume and the cell heat exchanger of the at least one compressor cell.

8. The system of claim 6, wherein:
the compressor cell buffer volume is disposed within a cell gas channel of the at least one compressor cell; and
the compressor cell buffer volume comprises an elongate cross sectional profile aligned with a direction of gas flow through the cell gas channel.

9. The system of claim 1, further comprising a controller configured to control operation of the compressor assembly and/or the MEMS expander assembly, wherein:
the MEMS expander assembly comprises a symmetric, trapezoidal, or spiral expander cell arrangement.

10. The system of claim 9, wherein:
the compressor assembly comprises a linear compressor; and
at least one of the plurality of expander cells comprises two or more expander cell buffer volumes disposed within the cell regenerator of the at least one expander cell with staggered relative positions along a direction of gas flow within the cell regenerator.

11. The system of claim 1, further comprising an electronic device, wherein:
the electronic device is coupled to the MEMS expander assembly; and
the electronic device comprises at least a part of a sensor system or an infrared camera.

12. A method comprising:
forming a microelectromechanical systems (MEMS) expander assembly, wherein the MEMS expander assembly comprises a plurality of expander cells each comprising a MEMS displacer, a cell regenerator, and an expansion volume disposed between the MEMS displacer and the cell regenerator, and wherein the plurality of cell regenerators are configured to combine to form a contiguous shared regenerator for the MEMS expander assembly;

placing the MEMS expander assembly in fluid communication with a compressor assembly via a gas transfer line, wherein the gas transfer line is configured to physically separate and thermally decouple the MEMS expander assembly from the compressor assembly.

13. The method of claim 12, wherein:
at least one of the plurality of expander cells comprises an expander buffer volume assembly; and
the forming the MEMS expander assembly comprises forming an expander cell buffer volume in the regenerator cell, forming a buffer volume valve disposed between the expander cell buffer volume and the expansion volume of the at least one expander cell, and forming an expander valve disposed between the expansion volume and the cell regenerator of the at least one expander cell.

14. The method of claim 12, wherein:
the cell regenerator comprises a plurality of regenerator matrix elements; and
each regenerator matrix element comprises an elongate cross sectional profile aligned with a direction of gas flow through the at least one expander cell.

15. The method of claim 12, wherein the compressor assembly comprises a MEMS compressor assembly, the method further comprising:
forming the MEMS compressor assembly, wherein the MEMS compressor assembly comprises a plurality of compressor cells each comprising a MEMS compressor, a cell heat exchanger, and a compression volume disposed between the MEMS compressor and the cell heat exchanger.

16. The method of claim 15, wherein:
at least one of the plurality of compressor cells comprises a compressor buffer volume assembly; and
the forming the MEMS compressor assembly comprises forming a compressor cell buffer volume, forming a buffer volume valve disposed between the compressor cell buffer volume and the compressor volume of the at least one compressor cell, and forming a compressor valve disposed between the compressor volume and the cell heat exchanger of the at least one compressor cell.

17. The method of claim 12, wherein the MEMS expander assembly, gas transfer line, and compressor assembly are coupled to form a MEMS refrigerator, the method further comprising:
compressing a working gas within the MEMS refrigerator using the compressor assembly;
displacing at least a first portion of the working gas into the MEMS expander assembly using the compressor assembly and the MEMS expander assembly;
expanding the working gas within the MEMS refrigerator using the MEMS expander assembly; and
displacing at least a second portion of the working gas into the compressor assembly using the compressor assembly and the MEMS expander assembly to transfer heat from the MEMS expander assembly to the compressor assembly.

18. A method comprising:
displacing at least a first portion of a working gas of a microelectromechanical systems (MEMS) refrigerator into a MEMS expander assembly of the MEMS refrigerator, wherein the MEMS expander assembly comprises a plurality of expander cells each comprising a MEMS displacer, a cell regenerator, and an expansion volume disposed between the MEMS displacer and the cell regenerator, and wherein the plurality of cell regenerators are configured to combine to form a contiguous shared regenerator for the MEMS expander assembly; and
expanding the working gas within the MEMS refrigerator using the MEMS expander assembly.

19. The method of claim 18, further comprising:
compressing a working gas within the MEMS refrigerator using a compressor assembly of the MEMS refrigerator, before the displacing the first portion of the working gas, wherein the MEMS expander assembly is in fluid communication with the compressor assembly via a gas transfer line configured to physically separate and thermally decouple the MEMS expander assembly from the compressor assembly.

20. The method of claim 18, further comprising:
displacing at least a second portion of the working gas into a compressor assembly of the MEMS refrigerator, after the expanding the working gas, to transfer heat from the MEMS expander assembly to the compressor assembly.

* * * * *